United States Patent
Feng et al.

(10) Patent No.: US 12,057,069 B2
(45) Date of Patent: Aug. 6, 2024

(54) DISPLAY SUBSTRATE AND DISPLAY PANEL

(71) Applicant: BOE Technology Group Co., Ltd., Beijing (CN)

(72) Inventors: Yu Feng, Beijing (CN); Li Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/788,111

(22) PCT Filed: May 31, 2021

(86) PCT No.: PCT/CN2021/097328
§ 371 (c)(1),
(2) Date: Jun. 22, 2022

(87) PCT Pub. No.: WO2022/252029
PCT Pub. Date: Dec. 8, 2022

(65) Prior Publication Data
US 2024/0169911 A1    May 23, 2024

(51) Int. Cl.
*G09G 3/3233* (2016.01)
*G09G 3/3258* (2016.01)

(52) U.S. Cl.
CPC ......... *G09G 3/3233* (2013.01); *G09G 3/3258* (2013.01); *G09G 2300/0426* (2013.01);
(Continued)

(58) Field of Classification Search
CPC ............... G09G 3/3233; G09G 3/3258; G09G 2300/0426; G09G 2300/0861;
(Continued)

(56) References Cited

U.S. PATENT DOCUMENTS

2016/0124491 A1* 5/2016 An .................. G06F 1/3265
                                                          713/323
2017/0047390 A1* 2/2017 Lee ............... H10K 59/131
(Continued)

FOREIGN PATENT DOCUMENTS

CN    110246984 A    9/2019
CN    111900260 A    11/2020
(Continued)

OTHER PUBLICATIONS

Sep. 1, 2023—(EP) Extended European Search Report Appn 21943406.5.

*Primary Examiner* — Premal R Patel
(74) *Attorney, Agent, or Firm* — Banner & Witcoff, Ltd.

(57) ABSTRACT

A display substrate and a display panel. The display substrate includes: a base substrate; and a plurality of sub-pixels on the base substrate, each of the plurality of sub-pixels includes a light-emitting element and a pixel circuit for driving the light-emitting element to emit light, the pixel circuit includes a driving sub-circuit, a data writing sub-circuit, a threshold compensation sub-circuit, a current-leakage prevention sub-circuit and a storage sub-circuit; the storage sub-circuit includes a storage capacitor, the storage capacitor includes a first electrode plate, a second electrode plate and a third electrode plate, the first electrode plate and the third electrode plate are electrically connected to each other and are in different layers with respect to the base substrate, and the second electrode plate at least partially overlaps the first electrode plate and the third electrode plate in a direction perpendicular to the base substrate.

20 Claims, 16 Drawing Sheets

(52) U.S. Cl.
CPC ............... *G09G 2300/0861* (2013.01); *G09G 2310/061* (2013.01); *G09G 2310/08* (2013.01); *G09G 2320/0233* (2013.01); *G09G 2320/0247* (2013.01); *G09G 2330/021* (2013.01)

(58) Field of Classification Search
CPC ......... G09G 2310/061; G09G 2310/08; G09G 2320/0233; G09G 2320/0247; G09G 2330/021
See application file for complete search history.

(56) References Cited

U.S. PATENT DOCUMENTS

| | | | |
|---|---|---|---|
| 2017/0270853 A1 | 9/2017 | Xiang et al. | |
| 2020/0168147 A1* | 5/2020 | Na | H01L 27/1222 |
| 2020/0403059 A1* | 12/2020 | Oh | H10K 59/1213 |
| 2021/0028258 A1 | 1/2021 | Lee et al. | |
| 2021/0057506 A1 | 2/2021 | Jo et al. | |

FOREIGN PATENT DOCUMENTS

| | | |
|---|---|---|
| CN | 211929490 U | 11/2020 |
| JP | 2013239456 A | 11/2013 |
| KR | 20100031059 A | 3/2010 |

\* cited by examiner

DISPLAY SUBSTRATE AND DISPLAY PANEL

The application is a U.S. National Phase Entry of International Application No. PCT/CN2021/097328 filed on May 31, 2021, designating the United States of America. The present application claims priority to and the benefit of the above-identified application and the above-identified application is incorporated by reference herein in its entirety.

TECHNICAL FIELD

The embodiment of the present disclosure relates to a display substrate and a display panel.

BACKGROUND

With the rapid development of organic light-emitting diode (OLED) in the display field, people have higher and higher requirements for display effects. Due to high display quality and other advantages, the application range of high-resolution display devices is becoming wider and wider. In the display field, the key technology is the design of the pixel circuit.

SUMMARY

At least one embodiment of the present disclosure provides a display substrate, comprising: a base substrate; and a plurality of sub-pixels on the base substrate; each of the plurality of sub-pixels comprises a light-emitting element and a pixel circuit for driving the light-emitting element to emit light, the pixel circuit comprises a driving sub-circuit, a data writing sub-circuit, a threshold compensation sub-circuit, a current-leakage prevention sub-circuit and a storage sub-circuit; the driving sub-circuit comprises a control terminal, a first terminal and a second terminal, and the driving sub-circuit is configured to control a driving current flowing through the light-emitting element; the data writing sub-circuit is connected to the first terminal of the driving sub-circuit, a data line and a scan signal line, and the data writing sub-circuit is configured to write a data signal provided by the data line into the first terminal of the driving sub-circuit in response to a gate scan signal provided by the scan signal line; the threshold compensation sub-circuit is connected to the second terminal of the driving sub-circuit, the current-leakage prevention sub-circuit and the scan signal line, and the threshold compensation sub-circuit is configured to write a compensation signal based on the data signal into the control terminal of the driving sub-circuit in response to the gate scan signal provided by the scan signal line; the current-leakage prevention sub-circuit is connected to the control terminal of the driving sub-circuit, the threshold compensation sub-circuit, the storage sub-circuit and a current-leakage prevention control signal line, and the current-leakage prevention sub-circuit is configured to prevent current-leakage of the control terminal of the driving sub-circuit; the storage sub-circuit is connected to the control terminal of the driving sub-circuit and a first voltage line, and the storage sub-circuit is configured to store the compensation signal and keep the compensation signal at the control terminal of the driving sub-circuit; the storage sub-circuit comprises a storage capacitor, and the storage capacitor comprises a first electrode plate, a second electrode plate and a third electrode plate, the first electrode plate and the third electrode plate are electrically connected to each other and are in different layers with respect to the base substrate, and the second electrode plate at least partially overlaps the first electrode plate and the third electrode plate in a direction perpendicular to the base substrate.

For example, in the display substrate provided by at least one embodiment of the present disclosure, the second electrode plate is between the first electrode plate and the third electrode plate in the direction perpendicular to the base substrate; and the first electrode plate is connected to the control terminal of the driving sub-circuit, the second electrode plate is connected to the first voltage line, the third electrode plate is connected to the control terminal of the driving sub-circuit.

For example, in the display substrate provided by at least one embodiment of the present disclosure, the threshold compensation sub-circuit comprises a threshold compensation transistor, and the data writing sub-circuit comprises a data writing transistor; an active layer of the threshold compensation transistor and an active layer of the data writing transistor are integrally formed, and an orthographic projection of the active layer of the threshold compensation transistor on the base substrate and an orthographic projection of the active layer of the data writing transistor on the base substrate are respectively on both sides of an orthographic projection of the storage capacitor on the base substrate; a gate electrode of the threshold compensation transistor and a gate electrode of the data writing transistor are parallel in a first direction, and the gate electrode of the threshold compensation transistor and the gate electrode of the data writing transistor are integrally formed with the scan signal line.

For example, in the display substrate provided by at least one embodiment of the present disclosure, the current-leakage prevention sub-circuit comprises a current-leakage prevention transistor, an active layer of the current-leakage prevention transistor, the active layer of the threshold compensation transistor and the active layer of the data writing transistor all extend along a second direction and are arranged side by side along the first direction, and the first direction intersects the second direction; and an orthographic projection of the active layer of the current-leakage prevention transistor on the base substrate is on a side of the orthographic projection of the active layer of the threshold compensation transistor on the base substrate away from the orthographic projection of the active layer of the data writing transistor on the base substrate.

For example, in the display substrate provided by at least one embodiment of the present disclosure, a gate electrode of the current-leakage prevention transistor and the current-leakage prevention control signal line are integrally formed, the current-leakage prevention control signal line extends along the first direction, and an orthographic projection of the current-leakage prevention control signal line on the base substrate is between an orthographic projection of the scan signal line on the base substrate and the orthographic projection of the storage capacitor on the base substrate.

For example, in the display substrate provided by at least one embodiment of the present disclosure, the current-leakage prevention control signal line comprises a first sub-control signal line and a second sub-control signal line, an orthographic projection of the first sub-control signal line on the base substrate and an orthographic projection of the second sub-control signal line on the base substrate at least partially overlap.

For example, in the display substrate provided by at least one embodiment of the present disclosure, the gate electrode of the current-leakage prevention transistor comprises a first gate electrode and a second gate electrode; the first gate electrode and the first sub-control signal line are integrally formed, and the second gate electrode and the second sub-control signal line are integrally formed; and the active layer of the current-leakage prevention transistor is between the first gate electrode and the second gate electrode in the direction perpendicular to the base substrate.

For example, in the display substrate provided by at least one embodiment of the present disclosure, the active layer of the current-leakage prevention transistor is on a same layer as the third electrode plate; a material of the active layer of the current-leakage prevention transistor and a material of the third electrode plate comprise an oxide semiconductor material.

For example, in the display substrate provided by at least one embodiment of the present disclosure, the pixel circuit further comprises a first reset sub-circuit; and the first reset sub-circuit is connected to the threshold compensation sub-circuit, the current-leakage prevention sub-circuit, a first initial signal line and a first reset control signal terminal, and is configured to apply an initial voltage provided by the first initial signal line to the control terminal of the driving sub-circuit through the current-leakage prevention sub-circuit in response to a reset control signal received by the first reset control signal terminal.

For example, in the display substrate provided by at least one embodiment of the present disclosure, the first reset sub-circuit comprises a first reset transistor; an active layer of the first reset transistor is integrally formed with the active layer of the threshold compensation transistor; an orthographic projection of the active layer of the first reset transistor on the base substrate is on a side of the orthographic projection of the active layer of the threshold compensation transistor on the base substrate away from the orthographic projection of the storage capacitor on the base substrate.

For example, the display substrate provided by at least one embodiment of the present disclosure, further comprises a first connecting electrode; a first terminal of the first connecting electrode is integrally formed with a first electrode of the first reset transistor and a first electrode of the threshold compensation transistor, and the first terminal of the first connecting electrode is respectively connected to the active layer of the compensation transistor and the active layer of the first reset transistor through a via hole passing through an insulating layer; a second terminal of the first connecting electrode is integrally formed with a first electrode of the current-leakage prevention transistor, and the second terminal of the first connecting electrode is connected to the active layer of the current-leakage prevention transistor through a via hole passing through an insulating layer.

For example, the display substrate provided by at least one embodiment of the present disclosure, further comprises a second connecting electrode; a first terminal of the second connecting electrode is integrally formed with a second electrode of the current-leakage prevention transistor, and the first terminal of the second connecting electrode is connected to the active layer of the current-leakage prevention transistor through a via hole passing through insulating layers; a second terminal of the second connecting electrode is connected to the first electrode plate of the storage capacitor through a via hole passing through an insulating layer; and a third terminal of the second connecting electrode is connected to the third electrode plate of the storage capacitor through a via hole passing through an insulating layer.

For example, the display substrate provided by at least one embodiment of the present disclosure, further comprises a parasitic capacitor, connected to the second electrode of the current-leakage prevention transistor and the scan signal line; a first electrode plate of the parasitic capacitor is integrally formed with the scan signal line; a second electrode plate of the parasitic capacitor and the first electrode plate of the parasitic capacitor at least partially overlap in the direction perpendicular to the base substrate, the second electrode plate of the parasitic capacitor and the third electrode plate of the storage capacitor are on a same layer, and an orthographic projection of the second electrode plate of the parasitic capacitor on the base substrate is between the orthographic projection of the active layer of the threshold compensation transistor on the base substrate and the orthographic projection of the active layer of the data writing transistor on the base substrate; and the second electrode plate of the parasitic capacitor is connected to a fourth terminal of the second connecting electrode through a via hole passing through an insulating layer.

For example, in the display substrate provided by at least one embodiment of the present disclosure, the driving sub-circuit comprises a driving transistor; a gate electrode of the driving transistor is integrally formed with the first electrode plate of the storage capacitor; and an active layer of the driving transistor, the active layer of the data writing transistor and the active layer of the threshold compensation transistor are integrally formed, and an orthographic projection of the active layer of the driving transistor on the base substrate is between the orthographic projection of the active layer of the data writing transistor on the base substrate and the orthographic projection of the active layer of the threshold compensation transistor on the base substrate.

For example, in the display substrate provided by at least one embodiment of the present disclosure, the pixel circuit further comprises a first light-emitting control sub-circuit and a second light-emitting control sub-circuit; the first light-emitting control sub-circuit is connected to the first voltage line, the first terminal of the driving sub-circuit, and a light-emitting control signal line, and the first light-emitting control sub-circuit is configured to apply a first voltage provided by the first voltage line to the first terminal of the driving sub-circuit in response to a light-emitting control signal provided by the light-emitting control signal line; the second light-emitting control sub-circuit is connected to the second terminal of the driving sub-circuit, a first terminal of the light-emitting element, and the light-emitting control signal line, and the second light-emitting control sub-circuit is configured to apply the driving current to the first terminal of the light-emitting element in response to the light-emitting control signal provided by the light-emitting control signal line; and the light-emitting control signal line extends along the first direction, and an orthographic projection of the light-emitting control signal line on the base substrate is on a side of the orthographic projection of the storage capacitor on the base substrate away from the orthographic projection of the scan signal line on the base substrate.

For example, in the display substrate provided by at least one embodiment of the present disclosure, the first light-emitting control sub-circuit comprises a first light-emitting control transistor, and the second light-emitting control sub-circuit comprise a second light-emitting control transistor; and an active layer of the first light-emitting control transistor, an active layer of the second light-emitting control transistor, the active layer of the data writing transistor, the active layer of the threshold compensation transistor, and the active layer of the driving transistor is integrally formed, and the orthographic projection of the active layer of the driving transistor on the base substrate is between orthographic projections of the active layer of the data writing transistor and the active layer of the first light-emitting control transistor and orthographic projections of the active layer of the second light-emitting control transistor and the active layer of the threshold compensation transistor.

For example, in the display substrate provided by at least one embodiment of the present disclosure, a current-leakage prevention control signal provided by the current-leakage prevention control signal line is identical to or different from the light-emitting control signal provided by the light-emitting control signal line.

For example, in the display substrate provided by at least one embodiment of the present disclosure, the first voltage line comprises a first sub-voltage line extending in the second direction and a second sub-voltage line extending in the first direction; the first sub-voltage line and the second sub-voltage line are at different layers; an orthographic projection of the first sub-voltage line on the base substrate is between the orthographic projection of the active layer of the data writing transistor on the base substrate and the orthographic projection of the active layer of the threshold compensation transistor on the base substrate, and at least partially overlaps with the orthographic projection of the second electrode plate of the parasitic capacitor on the base substrate; and the second sub-voltage line is integrally formed with the second electrode plate of the storage capacitor.

For example, the display substrate provided by at least one embodiment of the present disclosure, further comprises: a third connecting electrode; a first terminal of the third connecting electrode is integrally formed with a first electrode of the first light-emitting control transistor, and is connected to the active layer of the first light-emitting control transistor through a via hole passing through insulating layers; a second terminal of the third connecting electrode is connected to the second electrode plate of the storage capacitor through a via hole passing through an insulating layer; and a third terminal of the third connecting electrode is connected to a first protruding portion of the first sub-voltage line through a via hole passing through an insulating layer.

For example, in the display substrate provided by at least one embodiment of the present disclosure, the first sub-voltage line further comprises a second protruding portion, the second protruding portion is in a hollow square shape, and an orthographic projection of the second protruding portion on the base substrate at least partially overlaps the orthographic projection of the active layer of the current-leakage prevention transistor on the base substrate.

At least one embodiment of the present disclosure also provides a display panel including the display substrate according to any embodiment.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
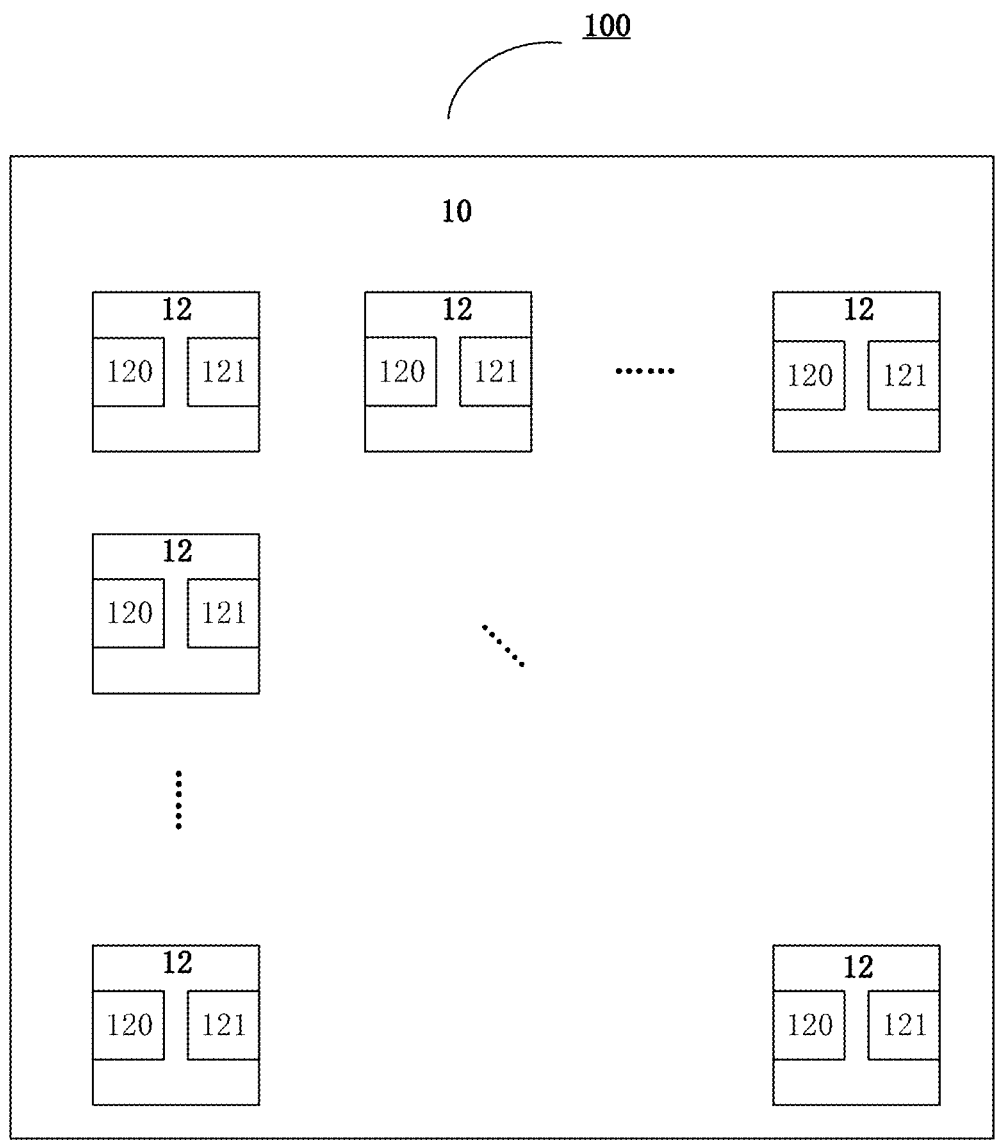
FIG. 1 is a schematic block diagram of a display substrate according to some embodiments of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the detailed description of some known functions and known components is omitted in the present disclosure.

During the operation of the pixel circuit manufactured based on LTPS (Low Temperature Poly-silicon), attention needs to be paid to the stability of gate voltage of driving transistor DTFT, because the stability of the gate voltage is related to display uniformity, flicker and other display quality of the display panel. In the existing pixel circuit based on LTPS, the leakage current of compensation transistor STFT cannot meet the requirement of low frequency (1~30 Hz) operation, resulting in display problems such as reduced compensation capability and increased flicker.

Oxide semiconductor thin film transistor (Oxide TFT) has the characteristics of good hysteresis characteristics, low leakage current (below 1e-14A), and low mobility, which can make up for the above shortcomings. Therefore, an oxide semiconductor thin film transistor may be used to replace the compensation transistor STFT based on LTPS to achieve the performance of low leakage current and ensure the stability of the gate voltage of the driving transistor DTFT. However, based on the existing technology, the size of the oxide semiconductor thin film transistor is larger than that of the transistor based on LTPS, and the film layer of the oxide semiconductor thin film transistor is different from that of the transistor based on LTPS, which involves issues such as adding via holes and insulating layers, and the pixel layout is difficult and needs to be improved.

Moreover, in the display field, the requirements for resolution are getting higher and higher, and the display panel is gradually showing a trend of high pixel density (Pixels Per Inch, PPI for short), for example, the resolution of mainstream displays has reached 460 PPI or more. Due to the requirement of high pixel density, the layout space of the pixel is small, and the storage capacitor of the pixel becomes smaller. However, the smaller storage capacitor is not conducive to the stability of the gate potential of the driving transistor, which affects the display uniformity of the display panel and causes flickering.

At least some embodiments of the present disclosure provide a display substrate and a display panel, the display substrate includes a base substrate and a plurality of sub-pixels on the base substrate, each of the plurality of sub-pixels includes a light-emitting element and a pixel circuit for driving the light-emitting element to emit light, the pixel circuit includes a driving sub-circuit, a data writing sub-circuit, a threshold compensation sub-circuit, a current-leakage prevention sub-circuit and a storage sub-circuit; the driving sub-circuit includes a control terminal, a first terminal and a second terminal, and the driving sub-circuit is configured to control a driving current flowing through the light-emitting element; the data writing sub-circuit is connected to the first terminal of the driving sub-circuit, a data line and a scan signal line, and the data writing sub-circuit is configured to write a data signal provided by the data line into the first terminal of the driving sub-circuit in response to a gate scan signal provided by the scan signal line; the threshold compensation sub-circuit is connected to the second terminal of the driving sub-circuit, the current-leakage prevention sub-circuit and the scan signal line, and the threshold compensation sub-circuit is configured to write a compensation signal based on the data signal into the control terminal of the driving sub-circuit in response to the gate scan signal provided by the scan signal line; the current-leakage prevention sub-circuit is connected to the control terminal of the driving sub-circuit, the threshold compensation sub-circuit, the storage sub-circuit and a current-leakage prevention control signal line, and the current-leakage prevention sub-circuit is configured to prevent current-leakage of the control terminal of the driving sub-circuit; the storage sub-circuit is connected to the control terminal of the driving sub-circuit and a first voltage line, and the storage sub-circuit is configured to store the compensation signal and keep the compensation signal at the control terminal of the driving sub-circuit, the storage sub-circuit includes a storage capacitor, and the storage capacitor includes a first electrode plate, a second electrode plate and a third electrode plate, the first electrode plate and the third electrode plate are electrically connected to each other and are in different layers with respect to the base substrate, and the second electrode plate at least partially overlaps the first electrode plate and the third electrode plate in a direction perpendicular to the base substrate.

In the display substrate provided by the embodiment of the present disclosure, by using a storage capacitor with at least three layers of electrode plates in the pixel circuit, the size of the storage capacitor can be effectively increased without increasing the occupied area, and the capacitance value of the storage capacitor can be improved, further, the stability of the gate potential of the driving transistor is improved, and the problem of insufficient pixel capacitance under the requirement of high pixel density is alleviated.

Several embodiments of the present disclosure will be described in detail below with reference to the accompanying drawings, but the present disclosure is not limited to these specific embodiments.

Figure 2A:
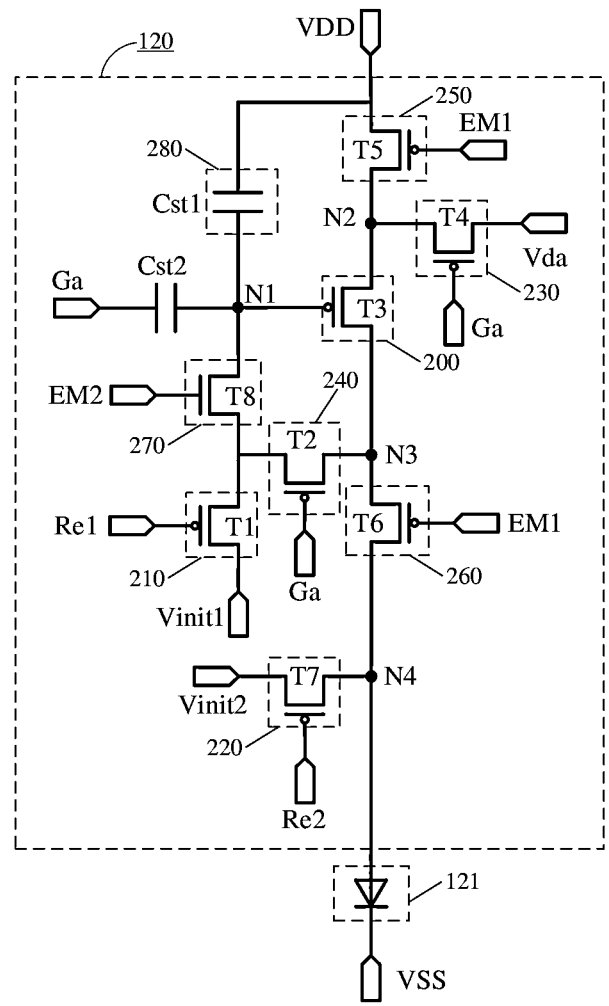
FIG. 2A is a schematic structural diagram of a pixel circuit according to some embodiments of the present disclosure.
Figure 2B:
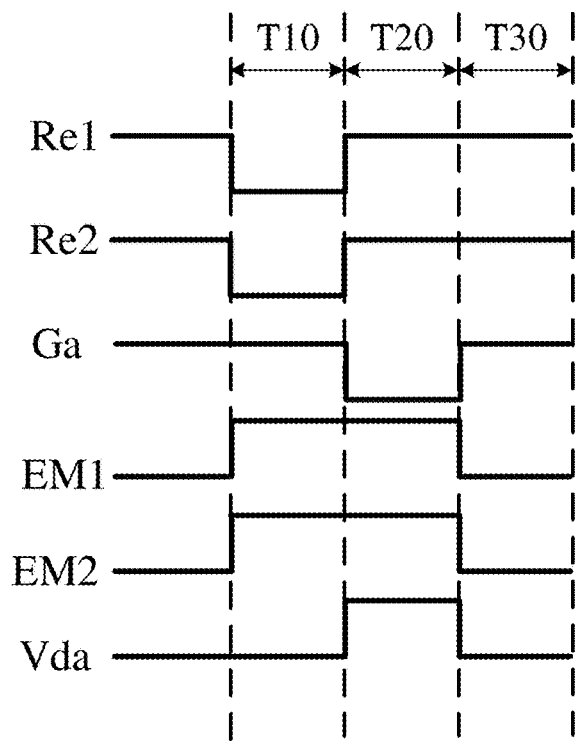
FIG. 2B is a circuit timing diagram of a pixel circuit according to some embodiments of the present disclosure.

FIG. 1 is a schematic block diagram of a display substrate according to some embodiments of the present disclosure, FIG. 2A is a schematic structural diagram of a pixel circuit according to some embodiments of the present disclosure, FIG. 2B is a circuit timing diagram of a pixel circuit according to some embodiments of the present disclosure.

For example, as shown in FIG. 1, a display substrate 100 provided by an embodiment of the present disclosure includes a base substrate 10 and a plurality of sub-pixels 12, a first voltage line, a data line, a scan signal line, a light-emitting control signal line, an initial signal line and a current-leakage prevention control signal line. It should be noted that, FIG. 1 does not show the first voltage line, the data line, the scan signal line, the light-emitting control signal line, the initial signal line and the current-leakage prevention control signal line.

For example, the display substrate 100 may be applied to a display panel such as an active matrix organic light-emitting diode (an AMOLED) display panel and the like. The display substrate 100 may be an array substrate.

For example, the base substrate 10 may be a flexible substrate or a rigid substrate. For example, the base substrate 10 may be made of glass, plastic, quartz or other suitable materials, which are not limited by the embodiments of the present disclosure.

For example, each sub-pixel 12 includes a light-emitting element 121 and a pixel circuit 120, and the light-emitting element 121 is located on a side of the pixel circuit 120 away from the base substrate 10. The sub-pixels 12 as shown in FIG. 1 are only to illustrate that each sub-pixel 12 includes two components, the light-emitting element 121 and the pixel circuit 120, and is not used to limit the positional relationship between the light-emitting element 121 and the pixel circuit 120. In some examples, the light-emitting element 121 and the pixel circuit 120 are arranged to overlap each other in a direction perpendicular to the base substrate 10.

For example, the pixel circuit 120 is configured to drive the light-emitting element 121 to emit light. The pixel circuit and its working principle will be described below with reference to FIG. 2A and FIG. 2B.

For example, as shown in FIG. 2A, the pixel circuit 120 includes a driving sub-circuit 200, a first reset sub-circuit 210, a second reset sub-circuit 220, a data writing sub-circuit 230, a threshold compensation sub-circuit 240, and a first light-emitting control sub-circuit 250, a second light-emitting control sub-circuit 260, a current-leakage prevention sub-circuit 270 and a storage sub-circuit 280.

For example, as shown in FIG. 2A, the driving sub-circuit 200 includes a control terminal, a first terminal and a second terminal, and the driving sub-circuit 200 is configured to control a driving current flowing through the light-emitting element 121. For example, the control terminal of the driving sub-circuit 200 is connected to a first node N1, the first terminal is connected to a second node N2, and the second terminal is connected to a third node N3.

The data writing sub-circuit 230 is connected to the first terminal of the driving sub-circuit 200, the data line Vda and the scan signal line Ga, and the data writing sub-circuit 230 is configured to write a data signal provided by the data line Vda into the first terminal of the driving sub-circuit 200 in response to a gate scan signal provided by the scan signal line Ga.

The threshold compensation sub-circuit 240 is connected to the second terminal of the driving sub-circuit 200, the current-leakage prevention sub-circuit 270 and the scan signal line Ga, and the threshold compensation sub-circuit 240 is configured to write a compensation signal based on the data signal into the control terminal of the driving sub-circuit 200 in response to the gate scan signal provided by the scan signal line Ga.

The current-leakage prevention sub-circuit 270 is connected to the control terminal of the driving sub-circuit 200, the threshold compensation sub-circuit 240, the storage sub-circuit 280 and a current-leakage prevention control signal line EM2, and the current-leakage prevention sub-circuit 270 is configured to prevent current-leakage of the control terminal of the driving sub-circuit 200.

The first light-emitting control sub-circuit 250 is connected to the first voltage line VDD, the first terminal of the driving sub-circuit 200, and a light-emitting control signal line EM1, and the first light-emitting control sub-circuit 250 is configured to apply a first voltage provided by the first voltage line VDD to the first terminal of the driving sub-circuit 200 in response to a light-emitting control signal provided by the light-emitting control signal line EM1.

The second light-emitting control sub-circuit 260 is connected to the second terminal of the driving sub-circuit 200, a first terminal of the light-emitting element 121, and the light-emitting control signal line EM1, and the second light-emitting control sub-circuit 260 is configured to apply the driving current to the first terminal of the light-emitting element 121 in response to the light-emitting control signal provided by the light-emitting control signal line EM1.

The first reset sub-circuit 210 is connected to the threshold compensation sub-circuit 240, the current-leakage prevention sub-circuit 270, a first initial signal line Vinit1 and a first reset control signal terminal Re1, and the first reset sub-circuit 210 is configured to apply an initial voltage provided by the first initial signal line to the control terminal of the driving sub-circuit 200 through the current-leakage prevention sub-circuit 270 in response to a reset control signal received by the first reset control signal terminal Re1.

For example, in the process that the first reset sub-circuit 240 transmits the initial voltage provided by the first initial signal line Vinit1 to the control terminal of the driving sub-circuit 200 to initialize the control terminal of the driving sub-circuit 200, the current-leakage prevention sub-circuit 270 is configured to be turned on under the control of the current-leakage prevention control signal, so that the initial voltage is transmitted to the control terminal (ie, the first node N1) of the driving sub-circuit 200 through the current-leakage prevention sub-circuit 270 to initialize the control terminal of the driving sub-circuit 200.

The second reset sub-circuit 220 is connected to a second initial signal line Vinit2, a second reset control signal terminal Re2 and the first terminal of the light-emitting element 121, and the second reset sub-circuit 220 is configured to apply an initial voltage provided by the second initial signal line Vinit2 to the first terminal of the light-emitting element 121 in response to a reset control signal received by the second reset control signal terminal Re2.

For example, the initial voltage provided by the first initial signal line Vinit1 and the initial voltage provided by the second initial signal line Vinit2 may be the same or different.

The storage sub-circuit 280 is connected to the control terminal of the driving sub-circuit 200 and the first voltage line VDD, and the storage sub-circuit 280 is configured to store the compensation signal and keep the compensation signal at the control terminal of the driving sub-circuit 200.

For example, the storage sub-circuit 200 includes a storage capacitor Cst1, and the storage capacitor Cst1 includes a first electrode plate, a second electrode plate and a third electrode plate, the first electrode plate and the third electrode plate are electrically connected to each other and are in different layers with respect to the base substrate, and the second electrode plate at least partially overlaps the first electrode plate and the third electrode plate in a direction perpendicular to the base substrate. By arranging at least three stacked electrode plates and electrically connecting the first electrode plate and the third electrode plate to each other, that is, the first electrode plate and the third electrode plate have the same potential, and the potential of the first electrode plate and the third electrode plate is different from the potential of the second electrode plate, forming a storage capacitor with a three-layer structure, which can increase the area of the storage capacitor and increase the capacitance value of the storage capacitor Cst1 without increasing the occupied space. For example, the capacitance value of the storage capacitor in the embodiment of the present disclosure can be increased by about 60%~80% from the capacitance value of the existing two-layer capacitor, for example, the capacitance value can be increased from 60 fF to 96 fF-108 fF, for example, increased to 100 fF, which is not limited by the embodiments of the present disclosure.

In the embodiment of the present disclosure, in the pixel circuit including the driving sub-circuit 200, the first reset sub-circuit 210, the second reset sub-circuit 220, the data writing sub-circuit 230, the threshold compensation sub-circuit 240, the first light-emitting control sub-circuit 250, the second light-emitting control sub-circuit 260, the current-leakage prevention sub-circuit 270 and the storage sub-circuit 280, using a storage capacitor with at least three layers of electrode plates can effectively increase the size of the storage capacitor without increasing the occupied space, and the capacitance value of the storage capacitor is increased, thereby improving the gate potential stability of the driving transistor and alleviating the problem of insufficient storage capacitance under high pixel density requirements.

For example, the pixel circuit 120 may further include a parasitic capacitor Cst2, the parasitic capacitor Cst2 is connected to the control terminal of the driving sub-circuit 200 and the scan signal line Ga, and the parasitic capacitor Cst2 is configured to adjust the voltage of the control terminal of the driving sub-circuit 200 in response to the scan signal provided by the scan signal line Ga. For example, according to the principle of charge conservation, the parasitic capacitance can increase the voltage of the control terminal of the driving sub-circuit 200 when the scan signal provided by the scan signal line Ga changes from a low level to a high level. The driving current of the pixel circuit is related to the voltage of the control terminal of the driving sub-circuit 200, and the voltage of the control terminal of the driving sub-circuit 200 is related to the data signal provided by the data line Vda. The voltage of the data signal provided by the data line Vda has an upper limit, for example, the upper limit is around 6V or 7V. To achieve a lower driving current, the data line Vda needs to provide a higher data signal voltage. Therefore, in actual use, the required voltage of the data signal may exceed the upper voltage limit of the data signal, so that the ideal driving current cannot be achieved. However, if the parasitic capacitor Cst2 is used to increase the voltage of the control terminal of the driving sub-circuit 200, the data line Vda may provide a slightly lower data signal voltage. Therefore, a lower driving current can also be achieved under the action of the parasitic capacitor Cst2, avoiding the problem that the required voltage of the data signal exceeds the upper limit of the voltage of the data signal and a lower driving current cannot be achieved.

For example, as shown in FIG. 2A, the second electrode of the light-emitting element 121 is electrically connected to a second voltage line VSS to receive a second voltage.

For example, the light-emitting element 121 may be a light-emitting diode or the like. The light-emitting diode may be a micro light-emitting diode (a Micro LED), an organic light-emitting diode (an OLED), or a quantum dot light-emitting diode (a QLED), and the like. The light-emitting element 121 is configured to receive a light-emitting signal (for example, a driving current) during operation, and emit light with an intensity corresponding to the light-emitting signal. The light-emitting element 121 may include a first electrode, a second electrode, and a light-emitting layer disposed between the first electrode and the second electrode. The first electrode of the light-emitting element 121 may be an anode electrode, and the second electrode of the light-emitting diode may be a cathode electrode. It should be noted that, in the embodiments of the present disclosure, the light-emitting layer of the light-emitting element may include the electroluminescent layer itself and other common layers located on both sides of the electroluminescent layer, for example, a hole injection layer, a hole transport layer, an electron injection layer and electron transport layer, etc. Generally, the light-emitting element 121 has a light-emitting threshold voltage, and light is emitted when the voltage between the first electrode and the second electrode of the light-emitting element 121 is greater than or equal to the light-emitting threshold voltage. In practical applications, the specific structure of the light-emitting element 121 may be designed and determined according to the actual application environment, which is not limited herein.

For example, as shown in FIG. 2A, the driving sub-circuit 200 includes a driving transistor T3, the first reset sub-circuit 210 includes a first reset transistor T1, the second reset sub-circuit 220 includes a second reset transistor T7, the data writing sub-circuit 230 includes a data writing transistor T4, the threshold compensation sub-circuit 240 includes a threshold compensation transistor T2, the first light-emitting control sub-circuit 250 includes a first light-emitting control transistor T5, the second light-emitting control sub-circuit 260 includes a second light-emitting control transistor T6, the current-leakage prevention sub-circuit 270 includes a current-leakage prevention transistor T8.

The control terminal of the driving sub-circuit 200 includes a gate electrode of the driving transistor T3, the first terminal of the driving sub-circuit 200 includes a first electrode of the driving transistor T3, and the second terminal of the driving sub-circuit 20 includes a second electrode of the driving transistor T3. The gate electrode of the driving transistor T3 is electrically connected to the first node N1, the first electrode of the driving transistor T3 is electrically connected to the second node N2, and the second electrode of the driving transistor T3 is electrically connected to the third node N3.

A gate electrode of the data writing transistor T4 is electrically connected to the scan signal line Ga, a first electrode of the data writing transistor T4 is electrically connected to the data line Vda, and the second electrode of the data writing transistor T4 is electrically connected to the second node N2, that is, the second electrode of the data writing transistor T4 is electrically connected to the first electrode of the driving transistor T3.

A gate electrode of the threshold compensation transistor T2 is electrically connected to the scan signal line Ga, a first electrode of the threshold compensation transistor T2 is electrically connected to a first electrode of the current-leakage prevention transistor T8, a second electrode of the threshold compensation transistor T2 is electrically connected to the third node N3, that is, the second electrode of the threshold compensation transistor T2 is electrically connected to the second electrode of the driving transistor T3.

A gate electrode of the first light-emitting control transistor T5 is electrically connected to the light-emitting control signal line EM1 to receive the light-emitting control signal, a first electrode of the first light-emitting control transistor T5 is electrically connected to the first voltage line VDD to receive the first voltage, and a second electrode of the first light-emitting control transistor T5 is electrically connected to the second node N2, that is, the second electrode of the first light-emitting control transistor T5 is electrically connected to the first electrode of the driving transistor T3.

A gate electrode of the second light-emitting control transistor T6 is electrically connected to the light-emitting control signal line EM1 to receive the light-emitting control signal. A first electrode of the second light-emitting control transistor T6 is electrically connected to a fourth node N4, that is, the first electrode of the second light-emitting control transistor T6 is electrically connected to the first electrode of the light-emitting element 121. A second electrode of the second light-emitting control transistor T6 is electrically connected to the third node N3, that is, second electrode of the second light-emitting control transistor T6 is electrically connected to the second electrode of the driving transistor T3.

A gate electrode of the first reset transistor T1 is electrically connected to the first reset control signal terminal Re1, a first electrode of the first reset transistor T1 is electrically connected to the first electrode of the threshold compensation transistor T2 and the first electrode of the current-leakage prevention transistor T8, and a second electrode of the reset transistor T1 is electrically connected to the first initial signal line Vinit1.

A gate electrode of the second reset transistor T7 is electrically connected to the second reset control signal terminal Re2, a first electrode of the second reset transistor T7 is electrically connected to the second initial signal line Vinit2, and a second electrode of the second reset transistor T7 is electrically connected to the fourth node N4, that is, the second electrode of the second reset transistor T7 is electrically connected to the first electrode of the light-emitting element 121.

A gate electrode of the current-leakage prevention transistor T8 is electrically connected to the current-leakage prevention control signal line EM2, a first electrode of the current-leakage prevention transistor T8 is electrically connected to the first electrode of the threshold compensation transistor T2 and the first electrode of the first reset transistor T1, and a second electrode of the current-leakage prevention transistor T8 is electrically connected to the first node N1, that is, the second electrode of the current-leakage prevention transistor T8 is electrically connected to the gate electrode of the driving transistor T3.

For example, in the case where the current-leakage prevention transistor T8 is not provided in the pixel circuit, the current leakage paths of the gate electrode of the driving transistor T3 are the transistors T1 and T2. In order to prevent current leakage, in some examples, the first reset transistor T1 and the threshold compensation transistor T2 may be set as dual-gate transistors. In the case where the current-leakage prevention transistor T8 is provided in the pixel circuit, the current leakage paths of the gate electrode of the driving transistor T3 are transistors T8-T1 and transistors T8-T2, which makes the leakage current less compared with the current leakage paths of the transistors T1 and T2 of the original pixel circuit, and the leakage current of the current-leakage prevention transistor T8 is a key reference index, so the first reset transistor T1 and the threshold compensation transistor T2 can be set as single-gate transistors to save space. The current-leakage prevention transistor T8 may be an oxide semiconductor thin film transistor (Oxide TFT). The oxide semiconductor thin film transistor has the characteristics of good hysteresis characteristics, low leakage current (below 1e-14A), and low mobility, so the oxide semiconductor thin film transistor may be used to ensure the stability of the gate voltage of the driving transistor.

For example, the first electrode plate CC1 of the storage capacitor Cst1 and the third electrode plate CC3 of the storage capacitor Cst1 are both electrically connected to the control terminal of the driving sub-circuit 200, and the second electrode plate CC2 of the storage capacitor Cst1 is electrically connected to the first voltage line VDD to receive the first voltage. The second electrode plate is located between the first electrode plate and the third electrode plate in the direction perpendicular to the base substrate.

For example, one of the voltage output by the first voltage line VDD and the voltage output by the second voltage line VSS is a high voltage, and the other is a low voltage. For example, in the embodiment as shown in FIG. 2A, the voltage output by the first voltage line VDD is a constant first voltage, and the first voltage is a positive voltage; and the voltage output by the second voltage line VSS is a constant second voltage, the second voltage is a negative voltage or the like. For example, in some examples, the second voltage line VSS may be grounded.

It should be noted that the transistors used in the embodiments of the present disclosure may be thin film transistors or field effect transistors or other switching elements with the same characteristics. The thin film transistors may include oxide semiconductor thin film transistors, amorphous silicon thin film transistors or polysilicon thin film transistors, etc. For example, in the description of the embodiment of the present disclosure, the driving transistor T3, the data writing transistor T4, the threshold compensation transistor T2, the first light-emitting control transistor T5, the second light-emitting control transistor T6, the first reset transistor T1 and the second reset transistor T7 may both be low temperature poly-silicon (LTPS for short) thin film transistors, and the current-leakage prevention transistor T8 may be an oxide semiconductor thin film transistor. The source and the drain of the transistor may be symmetrical in structure, so the source and the drain of the transistor may be indistinguishable in physical structure. In the embodiments of the present disclosure, in order to distinguish the transistors, in addition to the gate as the control electrode, one of the source and the drain is directly described as a first electrode and the other is described as a second electrode. Therefore, in the embodiments of the present disclosure, the first electrode and the second electrode of each of all or some of the transistors may be interchangeable as required.

For example, during specific implementation, in the embodiment of the present disclosure, an initial voltage Vi output by the first initial signal line Vinit1 and the second initial signal line Vinit2 and the voltage Vs output by the second voltage line VSS may satisfy the following formula: Vi−Vs<VEL. VEL represents the light-emitting threshold voltage of the light-emitting element 121. In some embodiments, the initial voltage of the first initial signal line Vinit1 and the initial voltage of the second initial signal line Vinit2 may be different. For example, the initial voltage of the first initial signal line Vinit1 is lower than that of the second initial signal line Vinit2, and the initial voltage of the first initial signal line Vinit1 is, for example, 0.5V~1V lower than the initial voltage of the second initial signal line Vinit2.

For example, the first reset control signal terminals Re1 of the pixel circuits in the yth row (y is an integer greater than 1) and the second reset control signal terminals Re2 of the pixel circuits in the (y−1)-th row are connected to the first reset signal line (not shown in the figure). The first reset control signal terminals Re1 of the pixel circuits in the (y+1)-th row and the second reset control signal terminal Re2 of the pixel circuits in the yth row are connected to the second reset signal line (not shown in the figure). That is, each row of sub-pixels is respectively connected to two reset signal lines (a first reset signal line and a second reset signal line) so that the two reset signal lines are respectively connected to the first reset control signal terminals Re1 and the second reset control signal terminals Re2. For example, a reset signal line (eg, the first reset signal line) is electrically connected to the gate electrodes (ie, the first reset control signal terminals Re1) of the first reset transistors T1 of the sub-pixels in current row to provide a first reset control signal, and the first reset signal line is also electrically connected to the gate electrodes (ie, the second reset control signal terminals Re2) of the second reset transistors T7 of the sub-pixels in the previous row to provide the sub-pixels in the previous row with a second reset control signal. Another reset signal line (eg, the second reset signal line) is electrically connected to the gate electrodes (ie, the first reset control signal terminals Re1) of the first reset transistors T1 corresponding to the pixel circuits of the next row (that is, the row of pixel circuits corresponding to the scan signal line turned on after the scan signal line in the current row according to the scan sequence of the scan signal lines), so as to provide the first reset control signal for the sub-pixels of the next row, and the second reset signal line is also electrically connected to the gate electrodes (ie, the second reset control signal terminals Re2) of the second reset transistors T7 of the pixel circuits in the current row. That is, every two adjacent rows of sub-pixels share one reset signal line.

For example, the second electrodes of the first reset transistors T1 of the pixel circuits in the yth row (y is an integer greater than 1) and the first electrodes of the second reset transistors T7 of the pixel circuits in the (y−1)-th row are connected to the first initial signal line Vinit1. The second electrodes of the first reset transistors T1 of the pixel circuits in the (y+1)-th row and the first electrodes of the second reset transistors T7 of the pixel circuits in the yth row are connected to the second initial signal line Vinit2. That is, each row of sub-pixels is respectively connected to two initial signal lines (the first initial signal line and the second initial signal line), so that the two initial signal lines are respectively connected to the first reset transistors T1 and the second reset transistors T7. For example, an initial signal line (eg. the first initial signal line Vinit1) is electrically connected to the first reset transistors T1 of the sub-pixels in current row to provide a first initial voltage, and the first initial signal line Vinit1 is also connected to the second reset transistors T7 of the sub-pixels in the previous row, so as to provide a second initial signal for the sub-pixels in the previous row. Another initial signal line (eg, the second initial signal line Vinit2) is electrically connected to the first reset transistors T1 corresponding to the pixel circuits of the next row (that is, the row of pixel circuits corresponding to the scan signal line turned on after the scan signal line in the current row according to the scan sequence of the scan signal lines) to provide the first initial control signal for the sub-pixels of the next row, and second initial signal line Vinit2 is also connected to the second reset transistors T7 of the pixel circuits of the current row. That is, every two adjacent rows of sub-pixels share one initial signal line.

The operation process of the pixel circuit as shown in FIG. 2A is described below with reference to FIG. 2B.

For example, as shown in FIG. 2B, Re1 represents the first reset control signal provided by the first reset control signal line, Re2 represents the second reset control signal provided by the second reset control signal line, Ga represents the gate scan signal output by the scan signal line Ga, EM1 represents the light-emitting control signal output by the light-emitting control signal line EM1, EM2 represents a current-leakage prevention control signal output by the current-leakage prevention control signal line EM2, Vda represents the data signal output by the data line Vda. It should be noted that, in the embodiments of the present disclosure, the reference numerals Re1, Re2, Ga, EM1, EM2, Vda, and VDD represent both signal lines and signals on the signal lines.

For example, the operation process of a pixel circuit in a display frame, the operation process of the pixel driving circuit has three stages: initialization stage T10, data writing and compensation stage T20, and light-emitting stage T30.

In the initialization stage T10, the first reset control signal Re1 and the second reset control signal Re2 are at a low level, the light-emitting control signal EM1, the current-leakage prevention control signal EM2 and the gate scan signal Ga are at a high level. The first reset transistor T1 is turned on under the control of the low level of the first reset control signal Re1, and the current-leakage prevention transistor T8 is turned on under the control of the high level of the current-leakage prevention control signal EM2. Thus, the initial voltage transmitted on the first initial signal line Vinit1 can be provided to the gate electrode of the driving transistor T1 to initialize the gate electrode of the driving transistor T1. And, the second reset transistor T7 is controlled to be turned on by the second reset control signal Re2, so that the initial voltage output by the second initial signal line Vinit2 is provided to the first electrode of the light-emitting element 121 to initialize the first electrode of the light-emitting element 121. In addition, at this stage, the first light-emitting control transistor T5 and the second light-emitting control transistor T6 are turned off under the control of the high level of the light-emitting control signal EM1, and the data writing transistor T4 is turned off under the control of the high level of the scan signal Ga.

In the data writing and compensation stage T20, the first reset control signal Re1 and the second reset control signal Re2 are at a high level, the light-emitting control signal EM1 and the current-leakage prevention control signal EM2 are at a high level, the gate scan signal Ga is at a low level. The data writing transistor T4 and the threshold compensation transistor T2 are turned on in response to the low level of the gate scan signal Ga. In addition, the current-leakage prevention transistor T8 is turned on in response to the high level of the current-leakage prevention control signal EM2, so that the data signal Vda transmitted on the data line can charge the gate electrode of the driving transistor T3 until the voltage of the gate electrode of the driving transistor T3 becomes Vda+Vth, the voltage Vda+Vth of the gate electrode of the driving transistor T3 is stored by the storage capacitor Cst1. Wherein, Vth represents the threshold voltage of the driving transistor T3, and Vda represents the voltage of the data signal. And, at this stage, the first reset transistor T1 is turned off in response to the low level of the first reset control signal Re1, the second reset transistor T7 is turned off in response to the low level of the second reset control signal Re2, and the first light-emitting control transistor T5 and the second light-emitting control transistor T6 is turned off in response to the high level of the light-emitting control signal EM1.

In the light-emitting stage T30, the first reset control signal Re1 and the second reset control signal Re2 are at a high level, the light-emitting control signal EM1 and the current-leakage prevention control signal EM2 are at a low level, and the gate scan signal Ga is at a high level. The first light-emitting control transistor T5 and the second light-emitting control transistor T6 are turned on in response to the low level of the light-emitting control signal EM1. The turned-on first light-emitting control transistor T5 supplies the voltage of the first voltage line VDD to the first electrode of the driving transistor T3, so that the voltage of the first electrode of the driving transistor T3 is VDD, and the voltage of the gate electrode of the driving transistor T3 is Vda+Vth, thus making the driving transistor T3 in a saturated state, so that the driving transistor T3 can generate a driving current Ids: $Ids=K*((Vda+Vth-VDD)-Vth)^2=K*(Vda-VDD)^2$, K is a structural constant related to process and design. The driving current Ids is provided to the light-emitting element 121 through the turned-on second light-emitting control transistor T6, and the light-emitting element 121 is driven to emit light. And, at this stage, the first reset transistor T1 is turned off in response to the low level of the first reset control signal Re1, and the second reset transistor T7 is controlled to be turned off in response to the low level of the second reset control signal Re2. The data writing transistor T2 and the threshold compensation transistor T4 are turned off in response to the high level of the gate scan signal Ga. The current-leakage prevention transistor T8 is turned off in response to the low level of the current-leakage prevention control signal EM2.

In another embodiment, in the case where the parasitic capacitor Cst2 is provided in the pixel circuit, in the light-emitting stage T30, when the gate scan signal Ga jumps from a low level to a high level, according to the principle of charge conservation of capacitor, the high level is coupled to the gate electrode of the driving transistor T3 through the parasitic capacitor Cst2, which causes the voltage of the gate electrode of the driving transistor T3 to increase. For example, the voltage of the gate electrode of the driving transistor T3 increases by Vcs, Vcs is, for example, 0.4V to 0.5V. Because Vda+Vth is less than VDD in the above calculation formula of Ids, Vda+Vth−VDD is a negative value. If the voltage of the gate electrode of the driving transistor T3 is increased by Ves on the basis of Vda+Vth, then the absolute value of Vda+Vth+Vcs−VDD is smaller than the absolute value of Vda+Vth−VDD, so the driving current Ids decreases.

The driving current Ids is related to the data signal Vda, the upper limit of the voltage of the data signal provided by the data line Vda is, for example, about 6V or 7V. To achieve a lower driving current, the data line Vda needs to provide a higher data signal voltage. In actual use, the required voltage of the data signal may exceed the upper voltage limit of the data signal. After the parasitic capacitor Cst2 is set, the voltage of the gate electrode of the driving transistor T3 is increased by the parasitic capacitor Cst2 in the light-emitting stage T30, the data line Vda may provide a slightly lower data signal voltage, thereby reducing the requirement for the data signal provided by the data line Vda. Therefore, a lower driving current can also be achieved under the action of the parasitic capacitor Cst2, so as to avoid causing the voltage of the data signal Vda to exceed its upper voltage limit.

For example, in some examples, the current-leakage prevention control signal provided by the current-leakage prevention control signal line EM2 and the light-emitting control signal provided by the light-emitting control signal line EM1 may be the same. For example, driving timing of the current-leakage prevention transistor T8, driving timing of the first light-emitting control transistor T5 and driving timing of the second light-emitting control transistor T6 may be the same. Therefore, the current-leakage prevention transistor T8, the first light-emitting control transistor T5 and the second light-emitting control transistor T6 may be simultaneously driven by the same signal.

Figure 2C:
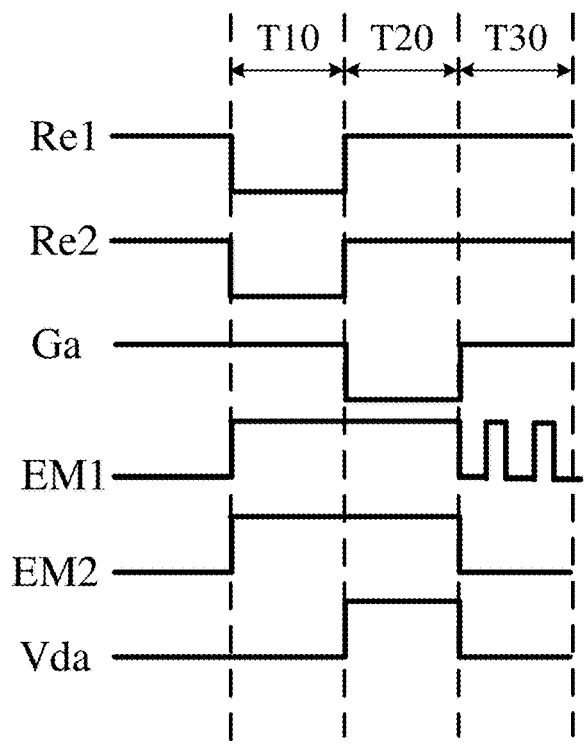
FIG. 2C is a circuit timing diagram of another pixel circuit according to some embodiments of the present disclosure.

For example, in some other examples, the current-leakage prevention control signal provided by the current-leakage prevention control signal line EM2 and the light-emitting control signal provided by the light-emitting control signal line EM1 may be different. The current-leakage prevention transistor T8 is individually controlled on and off by the current-leakage prevention control signal EM2, and the first light-emitting control transistor T5 and the second light-emitting control transistor T6 are controlled on and off by the light-emitting control signal EM1. In the light-emitting stage T30, the driving timing of the current-leakage prevention transistor T8, the driving timing of the first light-emitting control transistor T5 and the driving timing of the second light-emitting control transistor T6 may be different. For example, the current-leakage prevention control signal of the current-leakage prevention transistor T8 is always maintained at a low level during the light-emitting period T30, the light-emitting control signal of the first light-emitting control transistor T5 and the light-emitting control signal of the second light-emitting control transistor T6 are generally maintained at a low level during the light-emitting period T30 and may jump to a high level every predetermined time period (as shown in FIG. 2C), to reduce the light-emitting time of the light-emitting element 121, the light-emitting brightness of the light-emitting element 121 can be reduced in a short time, so that the power consumption of the pixel circuit can be reduced. Due to the persistence of vision phenomenon, the user cannot perceive the brightness change of the light-emitting element 121. Therefore, in the light-emitting stage T30, the driving timing of the current-leakage prevention transistor T8, the driving timing of the first light-emitting control transistor T5 and the driving timing of the second light-emitting control transistor T6 may be different. Therefore, the current-leakage prevention control signal line EM2 individually controls the current-leakage prevention transistor T8.

Figure 3:
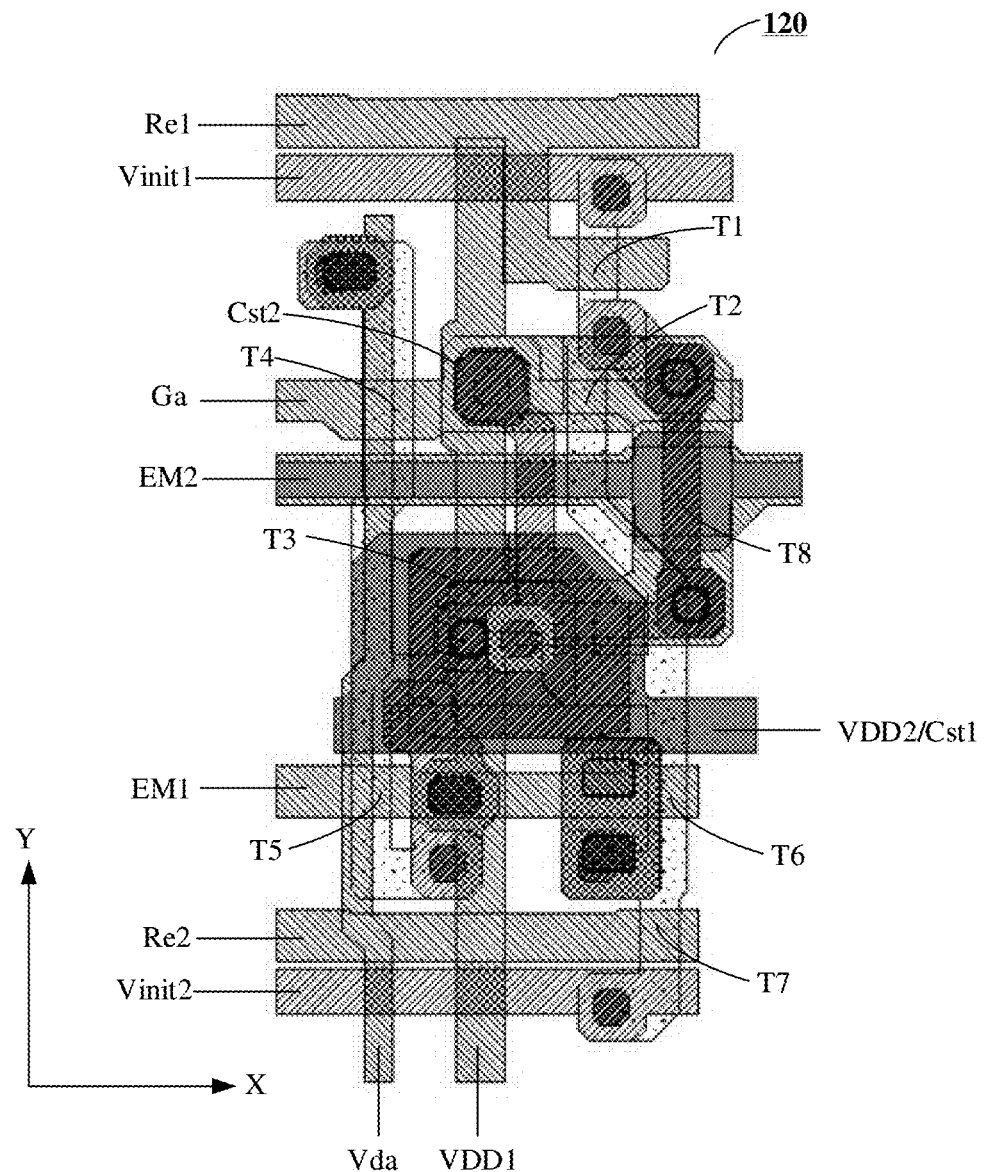
FIG. 3 is a schematic layout diagram of a pixel circuit according to some embodiments of the present disclosure.
Figure 4A:
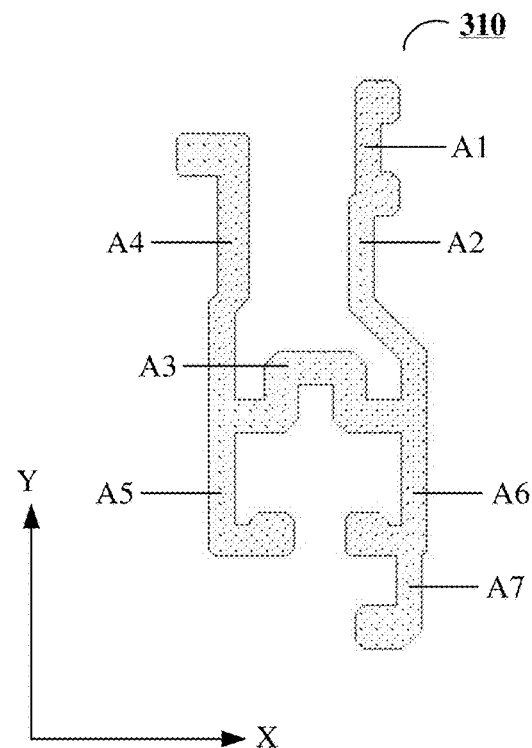
FIGS. 4A-4O are schematic diagrams of various structural layers of a pixel circuit according to some embodiments of the present disclosure.
Figure 4B:
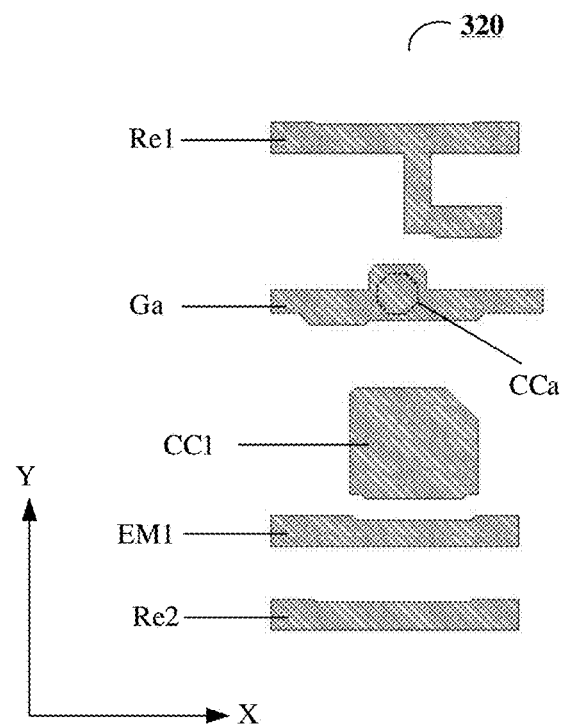
Figure 4C:
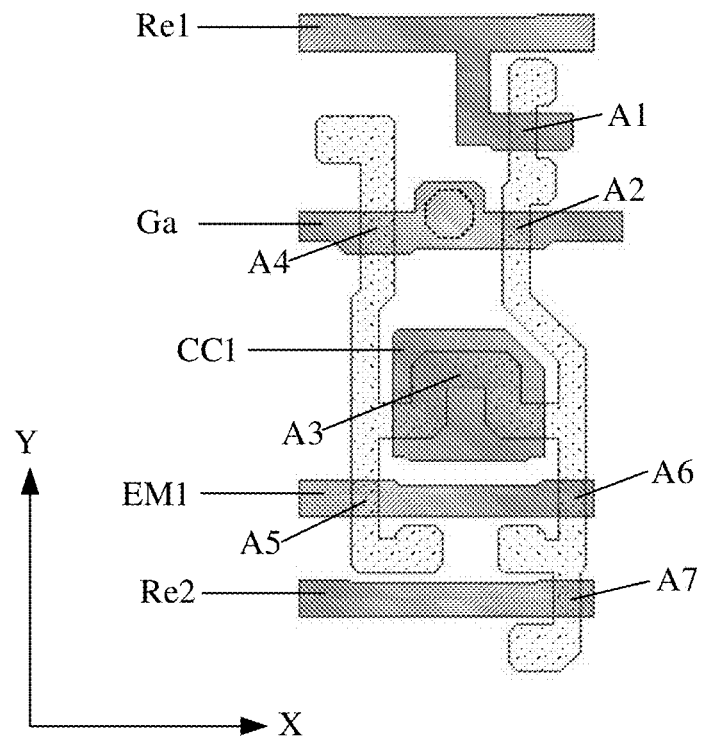
Figure 4D:
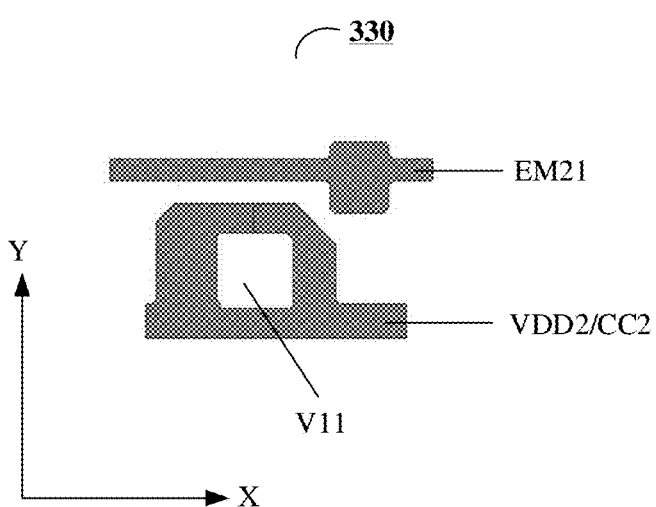
Figure 4E:
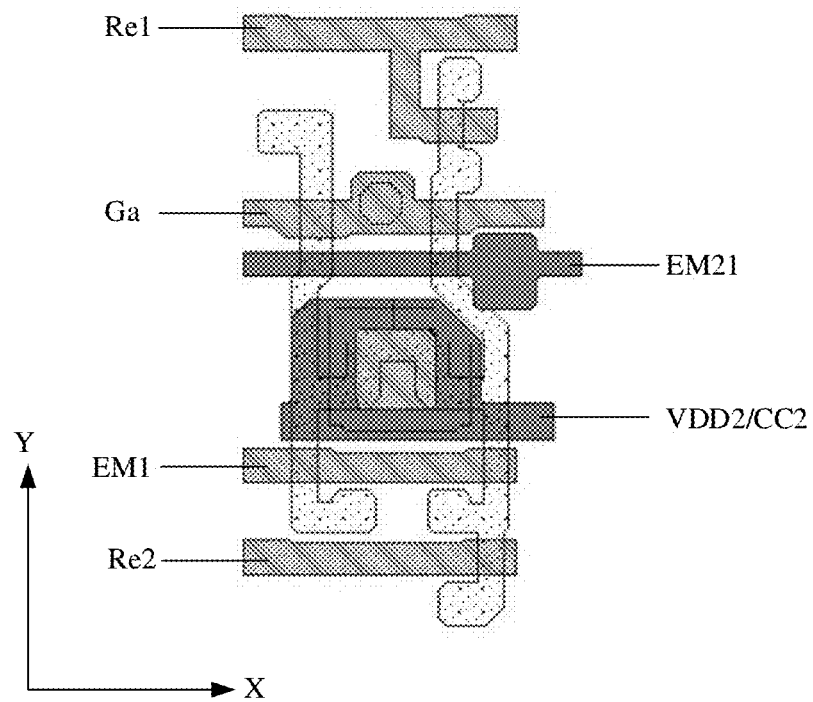
Figure 4F:
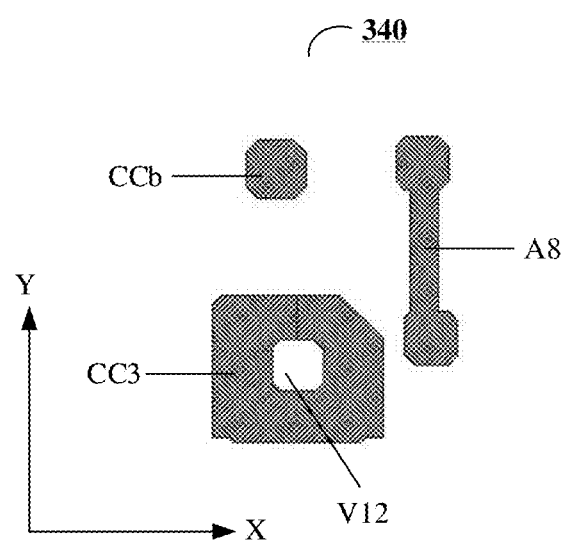
Figure 4G:
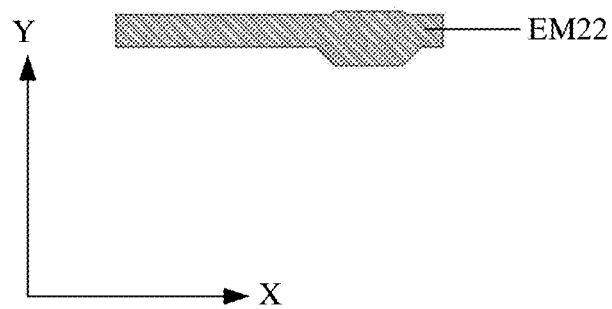
Figure 4H:
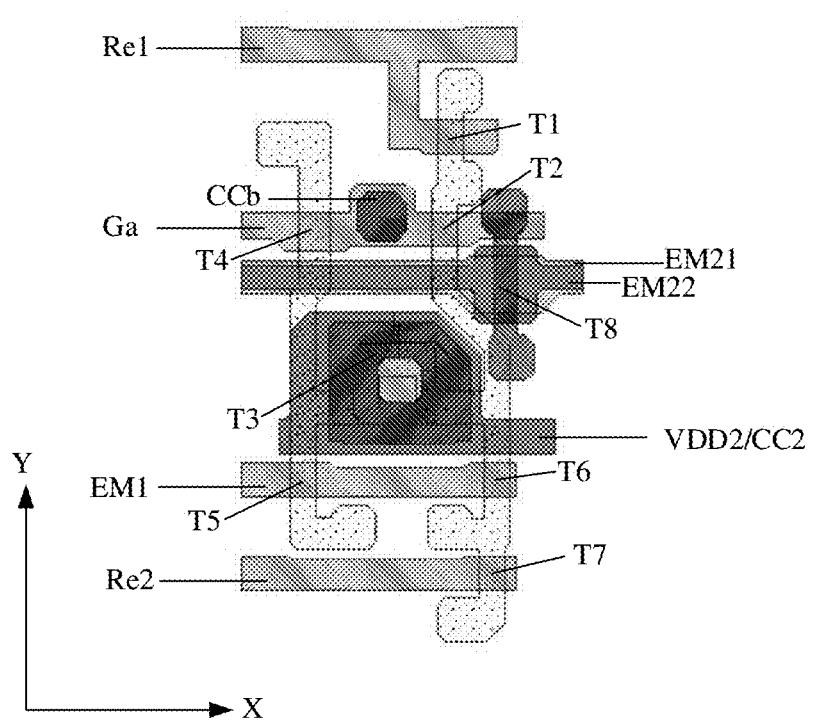
Figure 4I:
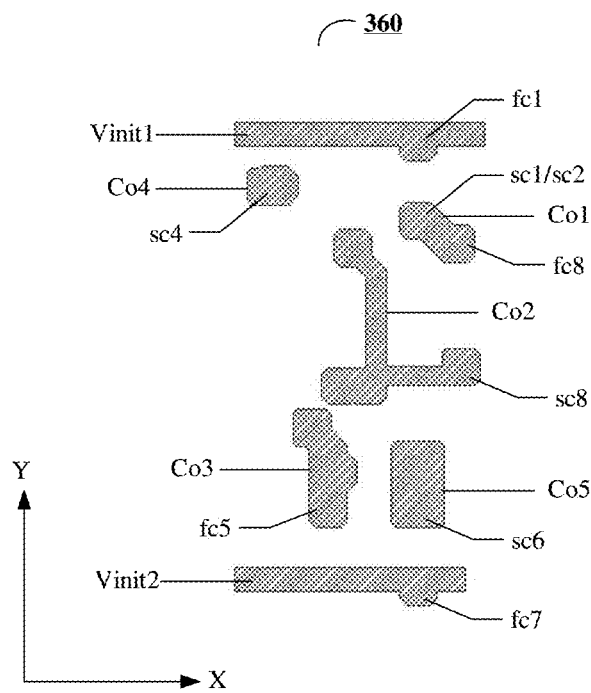
Figure 4J:
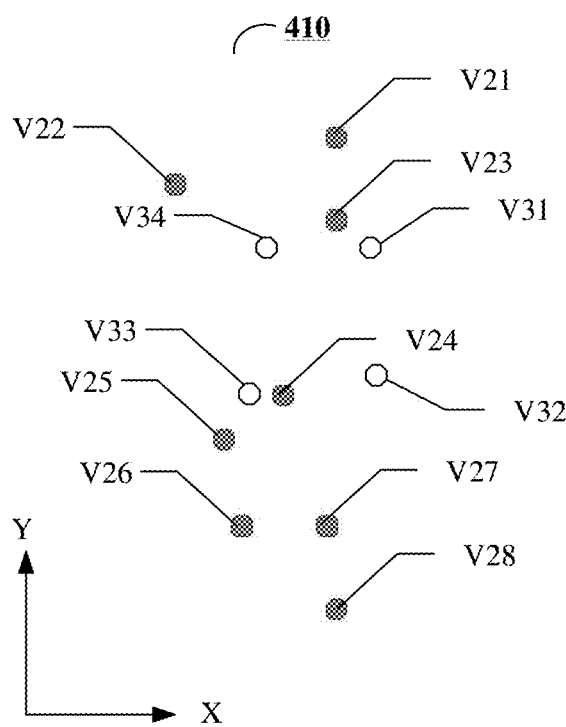
Figure 4K:
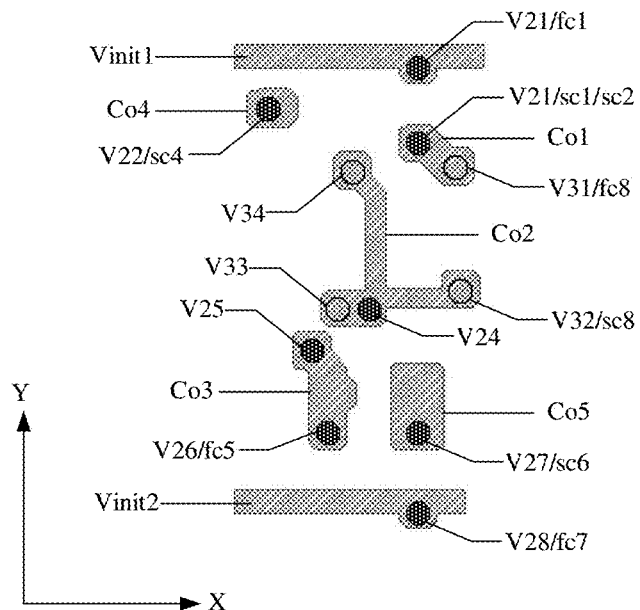
Figure 4L:
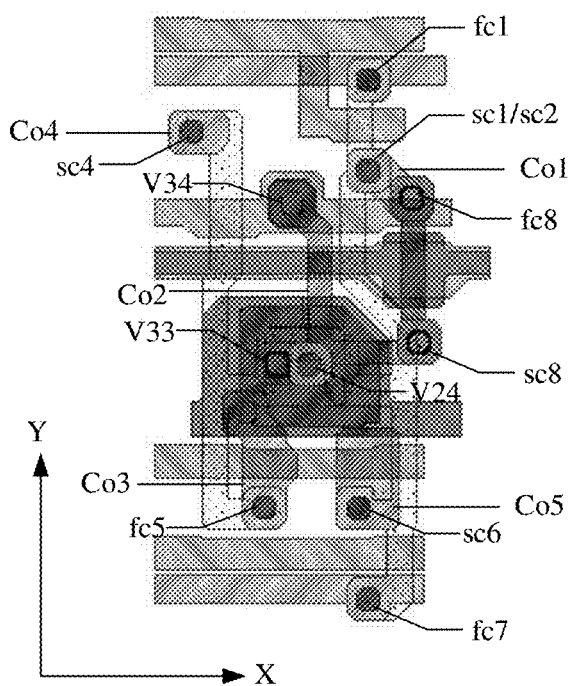
Figure 4M:
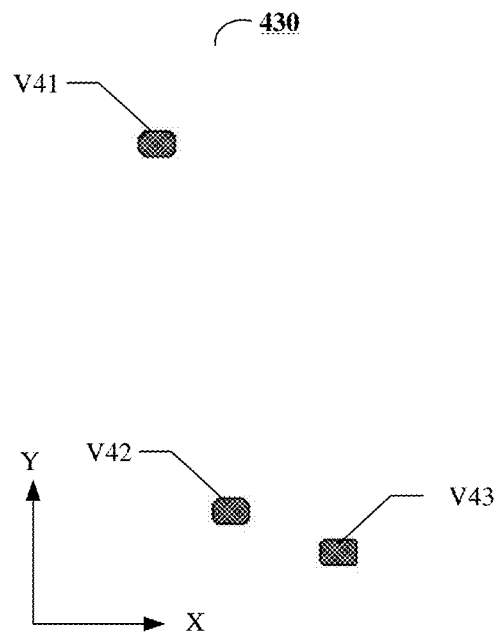
Figure 4N:
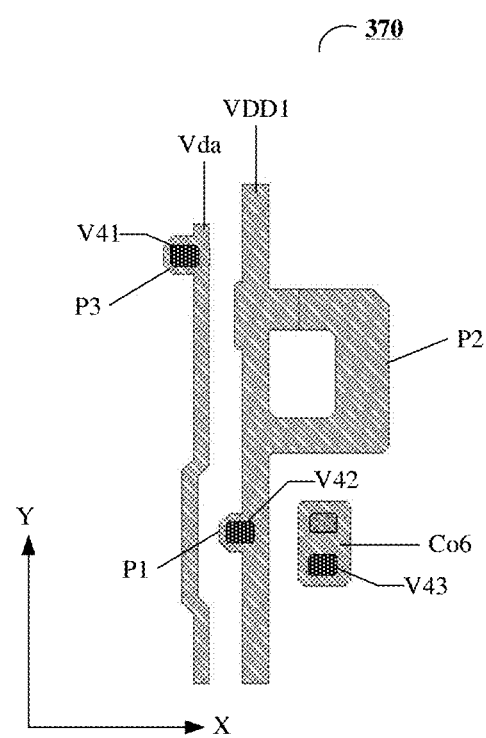
Figure 4O:
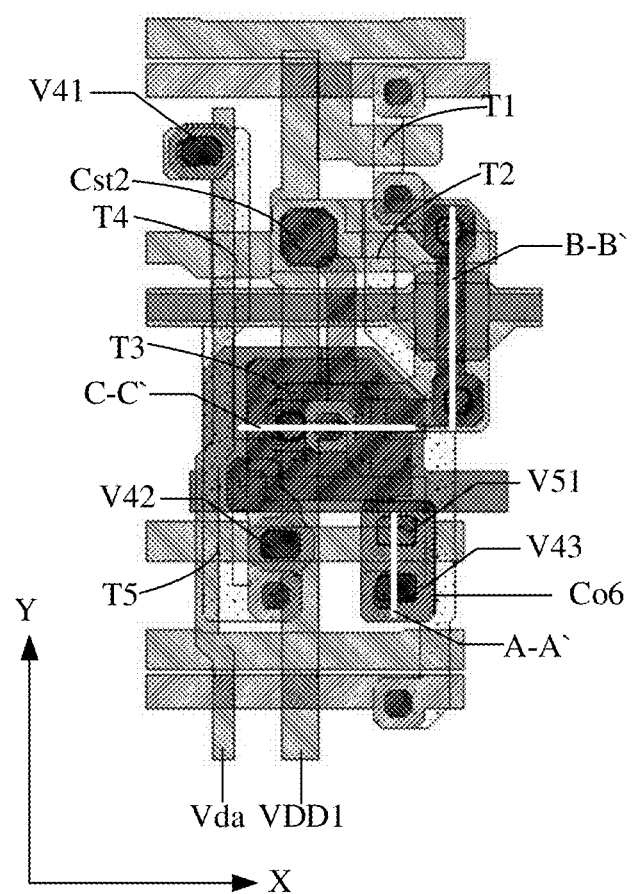

FIG. 3 is a schematic layout diagram of a pixel circuit according to some embodiments of the present disclosure, and FIGS. 4A-4O are schematic diagrams of various structural layers of a pixel circuit according to some embodiments of the present disclosure. For example, as shown in FIGS. 3 and 4A-4O, the description is made by taking the stacked structure of a pixel circuit 120 as an example.

FIG. 3 is a schematic layout diagram of the pixel circuit as shown in FIG. 2A, the display substrate may include a first active semiconductor layer, a first conductive layer, a second conductive layer, a second active semiconductor layer, a third conductive layer, a source and drain metal layer, a fourth conductive layer and an anode layer. FIGS. 4A-4O are schematic diagrams of various structural layers of a pixel circuit according to some embodiments of the present disclosure. Wherein FIG. 4A is a schematic diagram of the first active semiconductor layer 310, FIG. 4B is a schematic diagram of the first conductive layer 320, FIG. 4C is a schematic diagram of the stacking the first active semiconductor layer 310 and the first conductive layer 320, FIG. 4D is a schematic diagram of the second conductive layer 330, FIG. 4E is a schematic diagram of stacking the second conductive layer 330 with the stacked structure as shown in FIG. 4C. FIG. 4F is a schematic diagram of the second active semiconductor layer 340. FIG. 4G is a schematic diagram of the third conductive layer 350, FIG. 4H is a schematic diagram of stacking the second active semiconductor layer 340 and the third conductive layer 350 with the stacked structure as shown in FIG. 4E, FIG. 4I is a schematic diagram of the source and drain metal layer 360, FIG. 4J is a schematic diagram of insulating layer via holes, FIG. 4K is a schematic diagram of stacking the source and drain metal layer 360 with the insulating layer via holes, FIG. 4L is a schematic diagram of stacking the source and drain metal layer 360 with the stacked structure as shown in FIG. 4H, FIG. 4M is a schematic diagram of insulating layer via holes between the source and drain metal layer 360 and the fourth conductive layer 370, FIG. 4N is a schematic diagram of the fourth conductive layer 370, FIG. 4O is a schematic diagram of stacking the fourth conductive layer 370 with the stacked structure as shown in FIG. 4L.

For example, in the direction perpendicular to the base substrate 10, the first active semiconductor layer 310 is disposed between the base substrate 10 and the first conductive layer 320, the first conductive layer 320 is disposed between the first active semiconductor layer 310 and the second conductive layer 330, the second conductive layer 330 is disposed between the first conductive layer 320 and the second active semiconductor layer 340, the second active semiconductor layer 340 is disposed between the second conductive layer 330 and the third conductive layer 350, the third conductive layer 350 is disposed between the second active semiconductor layer 340 and the source and drain metal layer 360, the source and drain metal layer 360 is disposed between the third conductive layer 350 and the fourth conductive layer 370, and the fourth conductive layer 370 is disposed between the source and drain metal layer 360 and the anode layer (which is not shown in the figures).

For example, as shown in FIG. 3, the first reset signal line Re1, the first initial signal line Vinit1, the scan signal line Ga, the current-leakage prevention control signal line EM2, the light-emitting control signal line EM1, the second reset signal line Re2 and the second initial signal line Vinit2 extend along a first direction X, and are sequentially arranged from top to bottom along a second direction Y crossing the first direction X.

For example, in some embodiments, the first direction X and the second direction Y are perpendicular to each other. The first direction X may be parallel to the horizontal direction, and the second direction Y may be parallel to the vertical direction.

For example, in the second direction Y, the storage capacitor Cst1 is arranged between the light-emitting control signal line EM1 and the scan signal line Ga or between the light-emitting control signal line EM1 and the current-leakage prevention control signal line EM2. For example, as shown in FIG. 3, an orthographic projection of the light-emitting control signal line EM1 on the base substrate 10 is on a side of an orthographic projection of the storage capacitor Cst1 on the base substrate 10 away from an orthographic projection of the scan signal line Ga on the base substrate 10. And, in the second direction Y, the storage capacitor Cst1 is between the first reset signal line Re1 and the second reset signal line Re2. For example, as shown in FIG. 3, the orthographic projection of the storage capacitor Cst1 on the base substrate is between an orthographic projection of the first reset signal line Re1 on the base substrate and an orthographic projection of the second reset signal line Re2 on the base substrate.

For example, in the second direction Y, the first initial signal line Vinit1 is between the first reset signal line Re1 and the second reset signal line Re2, for example, as shown in FIG. 3, an orthographic projection of the first initial signal line Vinit1 on the base substrate is between the orthographic projection of the first reset signal line Re1 on the base substrate and the orthographic projection of the second reset signal line Re2 on the base substrate. For example, in the second direction Y, the second initial signal line Vinit2 is on a side of the second reset signal line Re2 away from the first reset signal line Re1, for example, as shown in FIG. 3, an orthographic projection of the second initial signal line Vinit2 on the base substrate is on a side of the orthographic projection of the second reset signal line Re2 on the base substrate away from the orthographic projection of the first reset signal line Re1 on the base substrate.

For example, the current-leakage prevention control signal line EM2 extends along the first direction X. In the second direction Y, the current-leakage prevention control signal line EM2 is between the scan signal line Ga and the storage capacitor Cst1, for example, as shown in FIG. 3, an orthographic projection of the current-leakage prevention control signal line EM2 on the base substrate 10 is between the orthographic projection of the scan signal line Ga on the base substrate 10 and the orthographic projection of the storage capacitor Cst1 on the base substrate 10.

For example, as shown in FIG. 3, the first voltage line VDD includes a first sub-voltage line VDD1 extending along the second direction Y and a second sub-voltage line VDD2 extending along the first direction X. The first sub-voltage line VDD1 and the second sub-voltage line VDD2 are at different layers, for example, the second sub-voltage line VDD2 is disposed in the second conductive layer 330, the first sub-voltage line VDD1 is disposed in the fourth conductive layer 370. The first sub-voltage line VDD1 and the second sub-voltage line VDD2 disposed in different layers are connected through via holes passing through insulating layers, so that the first voltage line VDD is wired in a grid on the base substrate, that is, the first sub-voltage line VDD1 and the second sub-voltage line VDD2 are arranged in a grid shape on the entire display substrate, so that the resistance of the first voltage line VDD is small and the voltage drop is low, thereby improving the stability of the power supply voltage provided by the first voltage line VDD.

For example, the data line Vda extends along the second direction Y, the data line Vda and the first sub-voltage line VDD1 are arranged along the first direction X.

For example, as shown in FIG. 3, in the first direction X, the data writing transistor T4 and the first light-emitting control transistor T5 are on a side of the storage capacitor Cst1, as shown on the left side of FIG. 3. The first reset transistor T1, the threshold compensation transistor T2, the second light-emitting control transistor T6 and the second reset transistor T7 are on the other side of the storage capacitor Cst1, as shown on the right side of FIG. 3. In the second direction Y, the data writing transistor T4, the first reset transistor T1 and the threshold compensation transistor are on a side of the storage capacitor Cst1, as shown on the upper side of FIG. 3. The first light-emitting control transistor T5, the second light-emitting control transistor T6 and the second reset transistor T7 are on the other side of the storage capacitor Cst1, as shown on the lower side of FIG. 3.

For example, as shown in FIG. 3, in the first direction X, the current-leakage prevention transistor T8 is on a side of the threshold compensation transistor T2 away from the data writing transistor T4. For example, an orthographic projection of the current-leakage preventing transistor T8 on the base substrate is on a side of an orthographic projection of the threshold compensation transistor T2 on the base substrate away from an orthographic projection of the data writing transistor T4 on the base substrate. In the second direction Y, the current-leakage preventing transistor T8 is on a side of the storage capacitor Cst1 away from the light-emitting control signal line EM1. For example, the orthographic projection of the current-leakage preventing transistor T8 on the base substrate is on a side of the orthographic projection of the storage capacitor Cst1 on the base substrate away from the orthographic projection of the light-emitting control signal line EM1 on the base substrate. The threshold compensation transistor T2, the data writing transistor T4 and the current-leakage preventing transistor T8 extend substantially along the second direction Y and are arranged along the first direction X.

For example, as shown in FIG. 3, in the first direction X, the parasitic capacitor Cst2 is between the data writing transistor T4 and the threshold compensation transistor T2. For example, an orthographic projection of the parasitic capacitor Cst2 on the base substrate is between the orthographic projection of the data writing transistor T4 on the base substrate and the orthographic projection of the threshold compensation transistor T2 on the base substrate. In the second direction Y, the parasitic capacitor Cst2 is on a side of the storage capacitor Cst1 away from the light-emitting control signal line EM1. For example, the orthographic projection of the parasitic capacitor Cst2 on the base substrate is on a side of the orthographic projection of the storage capacitor Cst1 on the base substrate away from the orthographic projection of the light-emitting control signal line EM1 on the base substrate. The orthographic projection of the parasitic capacitor Cst2 on the base substrate at least partially overlaps the orthographic projection of the scan signal line Ga on the base substrate.

For example, the first active semiconductor layer 310 is shown in FIG. 4A. As shown in FIG. 4A, the first active semiconductor layer 310 may be formed on the base substrate by patterning a semiconductor material. The first active semiconductor layer includes active layers A1-A7 of the transistors T1-T7, and the active layers of the transistors T1-T7 are disposed on a same layer. The active layer A1 of the first reset transistor T1, the active layer A2 of the threshold compensation transistor T2, the active layer A6 of the second light-emitting control transistor T6, and the active layer A7 of the second reset transistor T7 may be integrally formed, and may be integrated formed with the active layer A3 of the driving transistor T3, the active layer A4 of the data writing transistor T4, and the active layer A5 of the first light-emitting control transistor T5. The active layer of each transistor may include a source region, a drain region, and a channel region between the source region and the drain region.

For example, in the first direction X, the active layer A4 of the data writing transistor T4 and the active layer A5 of the first light-emitting control transistor T5 are on a first side of the active layer A3 of the driving transistor T3, as shown on the left side of FIG. 4A. The active layer A1 of the first reset transistor T1, the active layer A2 of the threshold compensation transistor T2, the active layer A6 of the second light-emitting control transistor T6, and the active layer A7 of the second reset transistor T7 are on a second side of the active layer A3 of the driving transistor T3, as shown on the right side of FIG. 4A.

For example, in the second direction Y, the active layer A1 of the first reset transistor T1, the active layer A2 of the threshold compensation transistor T2 and the active layer A4 of the data writing transistor T4 are on a third side of the active layer A3 of the driving transistor T3, as shown on the upper side of FIG. 4A. The active layer A5 of the first light-emitting control transistor T5, the active layer A6 of the second light-emitting control transistor T6 and the active layer A7 of the second reset transistor T7 are on a fourth side of the active layer A3 of the driving transistor T3, as shown on the lower side of FIG. 4A.

For example, the active semiconductor layer 310 may be made of amorphous silicon, polysilicon, oxide semiconductor materials, or the like. It should be noted that, the above-mentioned source region and drain region may be regions doped with n-type impurities or p-type impurities. In the embodiment of the present disclosure, the doped source region corresponds to the source of the transistor, and the doped drain region corresponds to the drain of the transistor.

For example, FIG. 4B shows the first conductive layer 320. As shown in FIG. 4B, the first reset signal line Re1, the second reset signal line Re2, the light-emitting control signal line EM1, and the scan signal line Ga are all disposed in the first conductive layer 320. In addition, the first conductive layer 320 may further include the first electrode plate CC1 of the storage capacitor Cst1, the gate electrode of the first reset transistor T1, the gate electrode of the threshold compensation transistor T2, the gate electrode of the data writing transistor T4, the gate electrode of the first light-emitting control transistor T5, the gate electrode of the second light-emitting control transistor T6, the gate electrode of the second reset transistor T7, and the gate electrode of the driving transistor T3. In addition, the first conductive layer 320 may further include a first electrode plate CCa of the parasitic capacitor Cst2.

For example, the scan signal line Ga is electrically connected to the gate electrode of the threshold compensation transistor T2 and the gate electrode of the data writing transistor T4 to control the threshold compensation transistor T2 and the data writing transistor T4 to be turned on or off. The light-emitting control signal line EM1 is electrically connected to the gate electrode of the first light-emitting control transistor T5 and the gate electrode of the second light-emitting control transistor T6 to control the first light-emitting control transistor T5 and the second light-emitting control transistor T6 to be turned on or off. The first reset signal line Re1 is electrically connected to the gate electrode of the first reset transistor T1 to control the first reset transistor T1 to be turned on or off. The second reset signal line Re2 is electrically connected to the gate electrode of the second reset transistor T7 to control the second reset transistor T7 to be turned on or off.

For example, as shown in FIG. 4B, the scan signal line Ga is connected to the first electrode plate CCa of the parasitic capacitor, for example, the first electrode plate CCa of the parasitic capacitor is integrally formed with the scan signal line Ga.

For example, FIG. 4C shows a schematic diagram of the stacked positional relationship between the first conductive layer 320 and the first active semiconductor layer 310. As shown in FIG. 4C, the scan signal line Ga is stacked with the active layer A2 of the threshold compensation transistor T2 and the active layer A4 of the data writing transistor T4. The light-emitting control signal line EM1 is stacked with the active layer A5 of the first light-emitting control transistor T5 and the active layer A6 of the second light-emitting control transistor T6. The first reset signal line Re1 is stacked with the active layer A1 of the first reset transistor T1, and the second reset signal line Re2 is stacked with the active layer A7 of the second reset transistor T7. The first electrode plate CC1 of the storage capacitor is stacked with the active layer A3 of the driving transistor T3.

For example, as shown in FIG. 4C, the gate electrode of the threshold compensation transistor T2 and the gate electrode of the data writing transistor T4 are integrally formed with the scan signal line Ga, and the gate electrode of the threshold compensation transistor T2 and the gate electrode of the data writing transistor T4 are parallel in the first direction. The gate electrode of the threshold compensation transistor T2 may be the portion where the scan signal line Ga overlaps with the active layer A2 of the threshold compensation transistor T2, and the gate electrode of the data writing transistor T4 may be a portion where the scan signal line Ga overlaps with the active layer A4 of the data writing transistor T4. The gate electrode of the first light-emitting control transistor T5 and the gate electrode of the second light-emitting control transistor T6 are integrally formed with the light-emitting control signal line EM1. The gate electrode of the first light-emitting control transistor T5 may be a portion where the light-emitting control signal line EM1 overlaps with the active layer A5 of the first light-emitting control transistor T5, and the gate electrode of the second light-emitting control transistor T6 may be a portion where the light-emitting control signal line EM1 overlaps with the active layer A6 of the second light-emitting control transistor T6. The gate electrode of the first reset transistor T1 is integrally formed with the first reset signal line Re1, the gate electrode of the first reset transistor T1 may be a portion where the first reset signal line Re1 overlaps with the active layer A1 of the first reset transistor T1. The gate electrode of the second reset transistor T7 is integrally formed with the second reset signal line Re2, the gate electrode of the second reset transistor T7 may be a portion where the second reset signal line Re2 overlaps with the active layer A7 of the second reset transistor T7. The gate electrode of the driving transistor T3 may be the first electrode plate CC1 of the storage capacitor Cst1, that is, the gate electrode of the driving transistor T3 and the first electrode plate CC1 of the storage capacitor are integrally formed.

For example, the first reset signal line Re1 is integrally formed with the gate electrode of the first reset transistor T1 of the pixel circuit in the yth row and the gate electrode of the second reset transistor T7 of the pixel circuit in the (y−1)-th row, that is, the first reset signal line Re1 is integrally formed with the gate electrode of the first reset transistor T1 of the sub-pixel in the current row and the gate electrode of the second reset transistor T7 of the sub-pixel in the previous row.

For example, the second reset signal line Re2 is integrally formed with the gate electrode of the first reset transistor T1 of the pixel circuit in the (y+1)-th row and the gate electrode of the second reset transistor T7 of the pixel circuit in the yth row, that is, the second reset signal line Re2 is integrally formed with the gate electrode of the second reset transistor T7 of the sub-pixel in the current row and the gate electrode of the first reset transistor T1 of the sub-pixel in the next row.

For example, as shown in FIG. 4C, in the direction perpendicular to the base substrate 10, a portion of the first active semiconductor layer 310 covered by the first electrode plate CC1 of the storage capacitor Cst1 is a channel region of active layer of the driving transistor T3, the channel region of active layer of the driving transistor T3 may be roughly in a shape of the Chinese character " 几 ". A portion of the first active semiconductor layer 310 covered by the light-emitting control signal line EM1 is a channel region of active layer of the first light-emitting control transistor T5 and a channel region of active layer of the second light-emitting control transistor T6. A portion of the first active semiconductor layer 310 covered by the scan signal line Ga is a channel region of active layer of the threshold compensation transistor T2 and a channel region of active layer of the data writing transistor T4. A portion of the first active semiconductor layer 310 covered by the first reset signal line Re1 is a channel region of active layer of the first reset transistor T1. A portion of the first active semiconductor layer 310 covered by the second reset signal line Re2 is a channel region of active layer of the second reset transistor T7.

For example, as shown in FIG. 3 and FIG. 4C, in the first direction X, an orthographic projection of the active layer A2 of the threshold compensation transistor T2 on the base substrate and an orthographic projection of the active layer A4 of the data writing transistor T4 on the base substrate are respectively on both sides of an orthographic projection of Cst1 on the base substrate. An orthographic projection of the active layer A3 of the driving transistor T3 on the base substrate is between an orthographic projection of the active layer A4 of the data writing transistor T4 on the base substrate and an orthographic projection of the active layer A2 of the threshold compensation transistor T2 on the base substrate. the orthographic projection of the active layer A3 of the driving transistor T3 on the base substrate is between orthographic projections of the active layer A4 of the data writing transistor T4 and the active layer A5 of the first light-emitting control transistor T5 and orthographic projections of the active layer A6 of the second light-emitting control transistor T6 and the active layer A2 of the threshold compensation transistor T2.

For example, in the second direction Y, an orthographic projection of the active layer A1 of the first reset transistor T1 on the base substrate is on a side of the orthographic projection of the active layer A2 of the threshold compensation transistor T2 on the base substrate away from the orthographic projection of the storage capacitor Cst1 on the base substrate. An orthographic projection of the active layer A7 of the second reset transistor T7 on the base substrate is on a side of an orthographic projection of the active layer A6 of the second light-emitting control transistor T6 on the base substrate away from the orthographic projection of the active layer A1 of the first reset transistor T1 on the base substrate.

For example, as shown in FIG. 4C, in the second direction Y, the gate electrode of the first reset transistor T1, the gate electrode of the threshold compensation transistor T2 and the gate electrode of the data writing transistor T4 are all on a first side of the gate electrode of the driving transistor T3, for example, the upper side of the gate electrode of the driving transistor T3 as shown in FIG. 4C. The gate electrode of the second reset transistor T7, the gate electrode of the first light-emitting control transistor T5, and the gate electrode of the second light-emitting control transistor T6 are on a second side of the gate electrode of the driving transistor T3, for example, the lower side of the gate electrode of the driving transistor T3 as shown in FIG. 4C.

For example, in some examples, the gate electrode of the current-leakage prevention transistor T8 and the current-leakage prevention control signal line EM2 are integrally formed. In the second direction Y, the gate electrode of the current-leakage prevention transistor T8 is on a side of the gate electrode of the driving transistor T3 away from the gate electrode of the second light-emitting control transistor T6, for example, the upper side of the gate electrode of the driving transistor T3 as shown in FIG. 3. The current-leakage prevention control signal line EM2 includes a first sub-control signal line EM21 and a second sub-control signal line EM22.

FIG. 4D shows a schematic diagram of the second conductive layer 330. As shown in FIG. 4D, the second conductive layer 330 includes the second electrode plate CC2 of the storage capacitor and the first sub-control signal line EM21, and the second electrode plate CC2 of the storage capacitor. It is integrally formed with the second sub-voltage line VDD2. The first sub-control signal line EM21 extends along the first direction X.

FIG. 4D shows a schematic diagram of the second conductive layer 330. As shown in FIG. 4D, the second conductive layer 330 includes the second electrode plate CC2 of the storage capacitor and the first sub-control signal line EM21, and the second electrode plate CC2 of the storage capacitor is integrally formed with the second sub-voltage line VDD2. The first sub-control signal line EM21 extends along the first direction X.

FIG. 4E is a schematic diagram of the stacking positional relationship of the first active semiconductor layer 310, the first conductive layer 320 and the second conductive layer 330. As shown in FIGS. 4C and 4E, an orthographic projection of the second electrode plate CC2 of the storage capacitor on the base substrate at least partially overlaps the orthographic projection of the first electrode plate CC1 of the storage capacitor on the base substrate. As shown in FIGS. 4C and 4E, in the second direction Y, the first sub-control signal line EM21 is between the second electrode plate CC2 and the scan signal line Ga. For example, an orthographic projection of the first sub-control signal line EM21 on the base substrate is between the orthographic projection of the second electrode plate CC2 on the base substrate and the orthographic projection of the scan signal line Ga on the base substrate.

FIG. 4F shows a schematic diagram of the second active semiconductor layer 340. As shown in FIG. 4F, the second active semiconductor layer 340 includes the active layer A8 of the current-leakage prevention transistor T8, the third electrode plate CC3 of the storage capacitor and a second electrode plate CCb of the parasitic capacitor. The material of the second active semiconductor layer 340 is, for example, an oxide semiconductor material, such as an indium gallium zinc oxide (IGZO for short) material, which is not limited in the embodiments of the present disclosure. That is, the material of the active layer A8 of the current-leakage prevention transistor, the material of the third electrode plate CC3 of the storage capacitor, and the material of the second electrode plate CCb of the parasitic capacitor include oxide semiconductor material. For example, the oxide semiconductor material is only used for the second active semiconductor layer 340, that is, the oxide semiconductor material, for example, only exists in the current-leakage prevention transistor T8 among the transistors T1~T8.

For example, the current-leakage prevention transistor T8 is an oxide semiconductor thin film transistor, the transistors T1~T7 are polysilicon thin film transistors, and the active layer A8 of the current-leakage prevention transistor T8 is disposed in different layer from the active layers A1~A7 of the transistors T1~T7, that is, the oxide semiconductor thin film transistor and the polysilicon thin film transistor are disposed in different layers.

For example, as shown in FIGS. 3, 4C and 4F, the active layer A8 of the current-leakage prevention transistor T8, the active layer A2 of the threshold compensation transistor T2 and the active layer A4 of the data writing transistor T4 all extend along the second direction Y and are arranged side by side along the first direction X. For example, although a partial region of the active layer A2 of the threshold compensation transistor T2 has a protruding portion and a bend portion, the active layer A2 extends substantially along the second direction Y. An orthographic projection of the active layer A8 of the current-leakage prevention transistor on the base substrate is on a side of the orthographic projection of the active layer A2 of the threshold compensation transistor on the base substrate away from the orthographic projection of the active layer A4 of the data writing transistor on the base substrate. Due to the extension direction and relative position of the active layer A2 of the threshold compensation transistor T2 and the active layer A8 of the current-leakage prevention transistor T8, the occupied area of the pixel circuit is saved, and it is convenient to connect two electrodes of the current-leakage prevention transistor T8 to the threshold compensation transistor T2 and the storage capacitor respectively, thereby avoiding wire winding and further reducing the occupied area.

FIG. 4G shows a schematic diagram of the third conductive layer 340. As shown in FIG. 4G, the third conductive layer 340 includes the second sub-control signal line EM22, and the second sub-control signal line EM22 extending along the first direction X.

For example, the current-leakage prevention control signal line EM2 includes a first sub-control signal line EM21 and a second sub-control signal line EM22, the first sub-control signal line EM21 is disposed in the second conductive layer 330, and the second sub-control signal line EM22 is disposed in the third conductive layer 350. And as shown in FIG. 4H, the orthographic projection of the first sub-control signal line EM21 on the base substrate at least partially overlaps with an orthographic projection of the second sub-control signal line EM22 on the base substrate.

FIG. 4H is a schematic diagram of stacking the second active semiconductor layer 340 and the third conductive layer 350 on the basis of FIG. 4E. As shown in FIG. 4H, in the direction perpendicular to the base substrate, the first sub-control signal line EM21 and the second sub-control signal line EM22 at least partially overlap with the active layer A8 of the current-leakage prevention transistor T8.

Figure 5A:
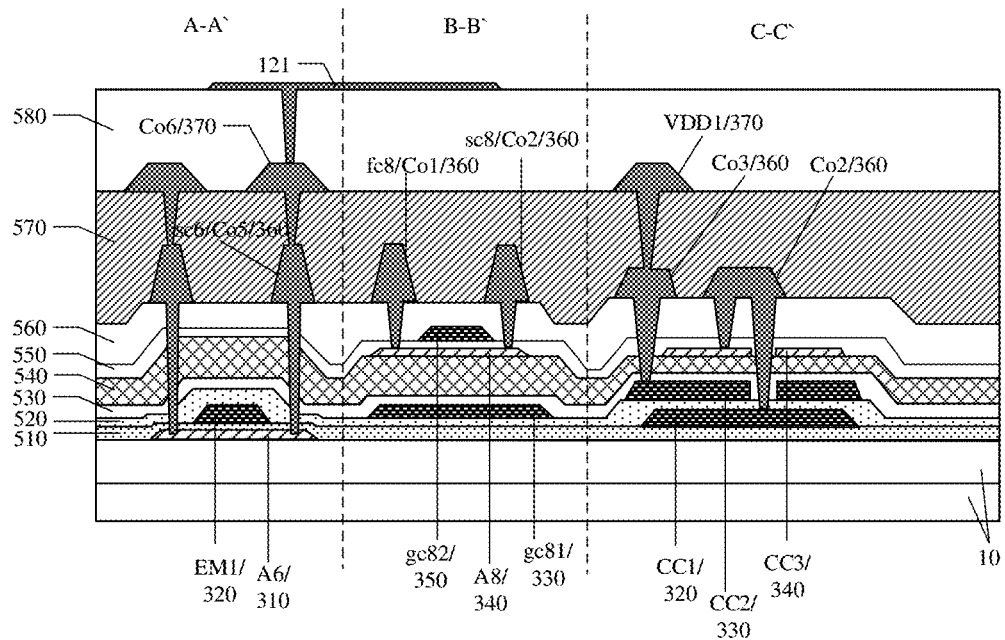
FIG. 5A is a schematic diagram of cross-sectional structures corresponding to three regions of a second light-emitting control transistor, a current-leakage prevention transistor and a storage capacitor as shown in FIG. 3.

For example, part B-B' of FIG. 5A shows a schematic diagram of cross-sectional structure corresponding to the current-leakage prevention transistor T8 in FIG. 3. As shown in FIG. 4H and the part B-B' of FIG. 5, the gate electrode of the current-leakage prevention transistor T8 includes a first gate electrode gc81 and a second gate electrode gc82, and the first gate electrode gc81 is integrally formed with the first sub-control signal line EM21. The first gate electrode gc81 may be the portion where the first sub-control signal line EM21 overlaps with the active layer A8 of the current-leakage prevention transistor T8. The second gate electrode gc82 is integrally formed with the second sub-control signal line EM22, and the second gate electrode gc82 may be a portion where the second sub-control signal line EM22 overlaps with the active layer A8 of the current-leakage prevention transistor T8. In the direction perpendicular to the base substrate, the active layer A8 of the current-leakage prevention transistor is between the first gate electrode gc81 and the second gate electrode gc82. Based on this solution, the current-leakage prevention transistor T8 is implemented as a double-gate transistor, which can improve the reliability of the current-leakage prevention transistor T8, for example, its performance of high temperature and high humidity resistance can be improved. And the two gate electrodes of the current-leakage prevention transistor T8 and the active layer A8 are arranged in the direction perpendicular to the base substrate, which can save the occupied area.

For example, part C-C' of FIG. 5A shows a schematic diagram of cross-sectional structure corresponding to the storage capacitor Cst1 in FIG. 3, and as shown in FIG. 4H and the part C-C' of FIG. 5A, the first electrode plate CC1 of the storage capacitor is disposed in the first conductive layer 320. As shown in FIG. 4D and the part C-C' of FIG. 5A, the second electrode plate CC2 of the storage capacitor is disposed in the second conductive layer 330. As shown in FIG. 4F and the part C-C' of 5A, the third electrode plate CC3 is disposed in the second active semiconductor layer 340. The first electrode plate CC1, the second electrode plate CC2 and the third electrode plate CC3 at least partially overlap in the direction perpendicular to the base substrate, so as to form the storage capacitor Cst1.

For example, as shown in FIGS. 4F and 4H, the second electrode plate CCb of the parasitic capacitor is disposed in the second active semiconductor layer 340, which is disposed in the same layer as the third electrode plate CC3 of the storage capacitor. The first electrode plate CCa of the parasitic capacitor is integrally formed with the scan signal line Ga, and the second electrode plate CCb of the parasitic capacitor and the first electrode plate CCa of the parasitic capacitor at least partially overlap in the direction perpendicular to the base substrate to form the parasitic capacitor Cst2. The orthographic projection of the second electrode plate CCb of the parasitic capacitor on the base substrate is between the orthographic projection of the active layer of the threshold compensation transistor T2 on the base substrate and the orthographic projection of the active layer of the data writing transistor T4 on the base substrate.

For example, at least one insulating layer is disposed between every two adjacent layers of the first active semiconductor layer 310, the first conductive layer 320, the second conductive layer 330, the second active semiconductor layer 340, the third conductive layer 350, the source and drain metal layer 360, the fourth conductive layer 370 and the anode layer (not shown). For example, as shown in FIG. 5A, a first insulating layer 510 is disposed between the first active semiconductor layer 310 and the first conductive layer 320, a second insulating layer 520 is disposed between the first conductive layer 320 and the second conductive layer 330, a third insulating layer 530 and a buffer layer 540 are disposed between the second conductive layer 330 and the second active semiconductor layer 340, a fourth insulating layer 550 is disposed between the second active semiconductor layer 340 and the third conductive layer 350, a fifth insulating layer 560 is disposed between the third conductive layer 350 and the source and drain metal layer 360, a sixth insulating layer 570 is disposed between the sour and drain metal layer 360 and the fourth conductive layer 370, a planarization layer 580 is disposed between the fourth conductive layer 370 and the anode layer.

For example, the first insulating layer 510 to the sixth insulating layer 570, the buffer layer 540 and the planarization layer 580 are all made of insulating material, such as inorganic insulating material such as silicon nitride, silicon oxide, silicon oxynitride, or other suitable material, so the buffer layer 540 and the planarization layer 580 may also serve as insulating layers.

FIG. 4I shows a schematic diagram of the source and drain metal layer 360, the source and drain metal layer 360 includes a first connecting electrode Co1, a second connecting electrode Co2, a third connecting electrode Co3, a fourth connecting electrode Co4, a fifth connecting electrode Co5, the first initial signal line Vinit1 and the second initial signal line Vinit2.

FIG. 4J shows a schematic diagram of insulating layer via holes, each of a plurality of insulating layer via holes V21~V28 and V31~V34 passing through a plurality of insulating layers. FIG. 4K shows a schematic diagram of stacking the source and drain metal layer 360 with the via holes through insulating layer, and FIG. 4L is a schematic diagram of stacking the source and drain metal layer 360 on the basis of FIG. 4H.

As shown in FIG. 4I to FIG. 4L, the first electrode sc1 of the first reset transistor T1 and the first electrode sc2 of the threshold compensation transistor T2 are the same electrode. A first terminal of the first connecting electrode Co1 is integrally formed with the first electrode sc1 of the first reset transistor T1 and the first electrode sc2 of the threshold compensation transistor T2, and the first terminal of the first connecting electrode Co1 is respectively connected to the active layer A2 of the compensation transistor T2 and the active layer A1 of the first reset transistor T1 through a via hole V21 passing through insulating layers. A second terminal of the first connecting electrode Co1 is integrally formed with a first electrode fc8 of the current-leakage prevention transistor T8, and the second terminal of the first connecting electrode Co1 is connected to the active layer A8 of the current-leakage prevention transistor T8 through a via hole V31 passing through insulating layers.

For example, the via hole V21 passes through the insulating layers between the source and drain metal layer 360 and the first active semiconductor layer 310, namely through the first insulating layer 510 to the fifth insulating layer 560 and the buffer layer 540, so that the first terminal of the first connecting electrode Co1 is connected to a source region or a drain region corresponding to the threshold compensation transistor T2 in the first active semiconductor layer 310. The via hole V31 passes through the insulating layers between the source and drain metal layer 360 and the second active semiconductor layer 340, namely through the fourth insulating layer 550 and the fifth insulating layer 560, so that the second terminal of the first connecting electrode Co1 is connected to a source region or a drain region corresponding to the current-leakage prevention transistor T8 in the second active semiconductor layer 340.

For example, a first terminal of the second connecting electrode Co2 is integrally formed with a second electrode sc8 of the current-leakage prevention transistor T8, and the first terminal of the second connecting electrode Co2 is connected to the active layer A8 of the current-leakage prevention transistor T8 through a via hole V32 passing through insulating layers. A second terminal of the second connecting electrode Co2 is connected to the first electrode plate CC1 of the storage capacitor through a via hole V24 passing through insulating layers. A third terminal of the second connecting electrode is connected to the third electrode plate CC3 of the storage capacitor through a via hole V33 passing through insulating layers.

For example, the via hole V32 passes through the insulating layers between the source and drain metal layer 360 and the second active semiconductor layer 340, namely through the fourth insulating layer 550 and the fifth insulating layer 560, so that the first terminal of the second connecting electrode Co2 is connected to the source region or the drain region corresponding to the current-leakage prevention transistor T8 in the second active semiconductor layer 340. The via hole V33 passes through the insulating layers between the source and drain metal layer 360 and the second active semiconductor layer 340, namely through the fourth insulating layer 550 and the fifth insulating layer 560, so that the third terminal of the second connecting electrode Co2 is connected to the third electrode plate CC3 in the second active semiconductor layer 340.

For example, the via hole V24 passes through the insulating layers between the source and drain metal layer 360 and the first conductive layer 320, namely through the second insulating layer 510 to the fifth insulating layer 560 and the buffer layer 540. For example, as shown in FIG. 4D, the second electrode plate CC2 of the storage capacitor is provided with a first conductive layer via hole V11. As shown in FIG. 4F, the third electrode plate CC3 of the storage capacitor is provided with a second conductive layer via hole V12. The first conductive layer via hole V11, the second conductive layer via hole V12 and the insulating layer via hole V24 at least partially overlap in the direction perpendicular to the base substrate. As shown in FIG. 5A, the second terminal of the second connecting electrode Co2 is connected to the first electrode plate CC1 of the storage capacitor in the first conductive layer 320 through the via hole V24 passing through the second insulating layer 510 to the fifth insulating layer 560 and the buffer layer 540 and the first conductive layer via hole V11 and the second conductive layer via hole V12.

Figure 5B:
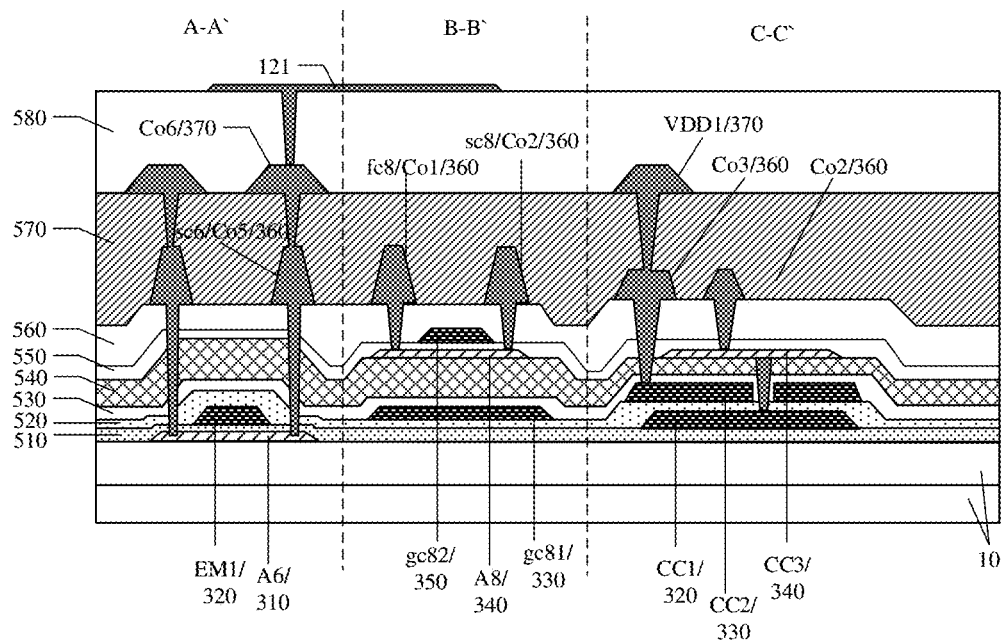
FIG. 5B is another schematic cross-sectional view according to some embodiments of the present disclosure.
Figure 5:
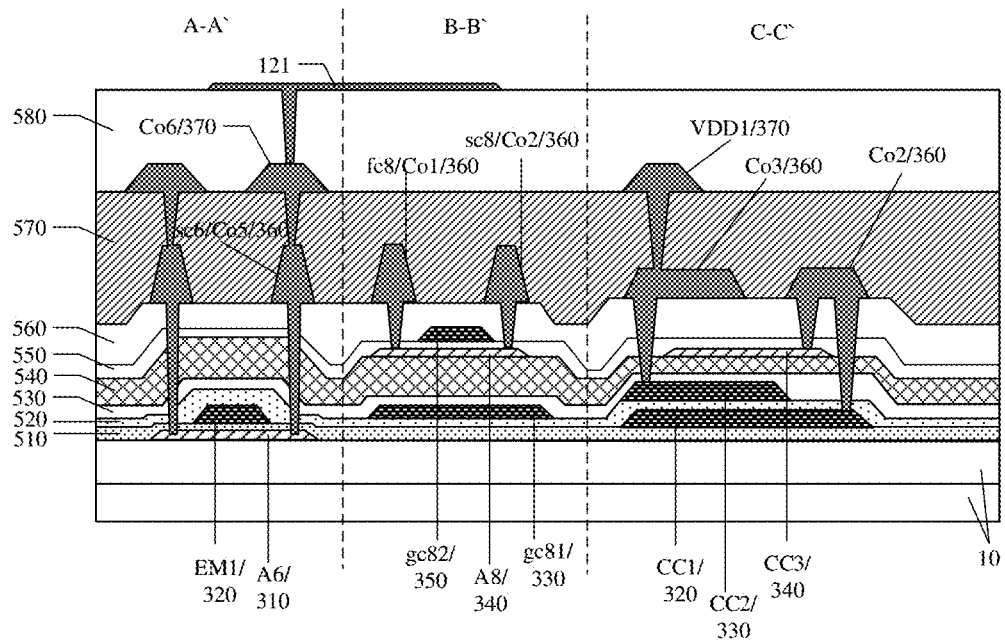
FIG. 5C is another schematic cross-sectional view according to some embodiments of the present disclosure.

For example, FIG. 5B is a schematic diagram of another cross-section provided by some embodiments of the present disclosure. The difference between FIG. 5B and FIG. 5A lies in the part C-C'. As shown in FIG. 5B, the third electrode plate CC3 may not be provided with via holes, the first electrode plate CC1 and the third electrode plate CC3 may be connected by via holes. For example, a via hole passing through insulating layers may be provided in the insulating layers (the second insulating layer 520, the third insulating layer 530 and the buffer layer 540) between the third electrode plate CC3 and the first electrode plate CC1, and the third electrode plate CC3 may be connected to the first electrode plate CC1 in the first conductive layer 320 through the insulating layer via hole and a via hole of the second electrode plate CC2. Because the third electrode plate CC3 is connected to the second connecting electrode Co2, the connection between the first electrode plate CC1 and the second connecting electrode Co2 can be realized.

For example, FIG. 5C is a schematic diagram of another cross-section provided by some embodiments of the present disclosure. The difference between FIG. 5C and FIG. 5A and the difference between FIG. 5C and FIG. 5B are the part C-C', as shown in FIG. 5C, a region overlapping with the first electrode plate CC1 and not overlapping with the third electrode plate CC3 may be provided on the second connecting electrode Co2, and an insulating layer via hole is arranged through the insulating layers (the second insulating layer 520 to the fifth insulating layer 560 and the buffer layer 540) corresponding to this region. The second connecting electrode Co2 is connected to the first electrode plate CC1 in the first conductive layer 320 through the insulating layer via hole without passing through the third electrode plate CC3, so there is no need to provide a via hole on the third electrode plate CC3.

As shown in FIG. 5C, in some embodiments, a region overlapping with the first electrode plate CC1 and not overlapping with the third electrode plate CC3 and the second electrode plate CC2 may be provided on the second connecting electrode Co2, and an insulating layer via hole is arranged through the insulating layers (the second insulating layer 520 to the fifth insulating layer 560 and the buffer layer 540) corresponding to this region. The second connecting electrode Co2 is directly connected to the first electrode plate CC1 in the first conductive layer 320 through the insulating layer via hole without passing through the third electrode plate CC3 and the second electrode plate CC2, so there is no need to provide via holes on the third electrode plate CC3 and the second electrode plate CC2.

For example, the second electrode plate CCb of the parasitic capacitor is connected to a fourth terminal of the second connecting electrode Co2 through a via hole V34 passing through insulating layers. The via hole V34 passes through the insulating layers between the source and drain metal layer 360 and the second active semiconductor layer 340, namely the fourth insulating layer 550 and the fifth insulating layer 560, so that the fourth terminal of the second connecting electrode Co2 is connected to the second electrode plate CCb of the parasitic capacitor in the second active semiconductor layer 340.

For example, a first terminal of the third connecting electrode Co3 is integrally formed with a first electrode fc5 of the first light-emitting control transistor T5, and is connected to the active layer A5 of the first light-emitting control transistor T5 through a via hole V26 passing through insulating layers. A second terminal of the third connecting electrode Co3 is connected to the second electrode plate CC2 of the storage capacitor through a via hole V25 passing through insulating layers.

For example, the via hole V26 passes through the insulating layers between the source and drain metal layer 360 and the first active semiconductor layer 310, namely through the first insulating layer 510 to the fifth insulating layer 560 and the buffer layer 540, so that the first terminal of the third connecting electrode Co3 is connected to a source region or a drain region corresponding to the first light-emitting control transistor T5 in the first active semiconductor layer 310. The via hole V25 passes through the insulating layers between the source and drain metal layer 360 and the second conductive layer 330, namely through the third insulating layer 530 to the fifth insulating layer 560 and the buffer layer 540, so that the second terminal of the third connecting electrode Co3 is connected to the second electrode plate CC2 in the second conductive layer 320.

For example, the fourth connecting electrode Co4 is integrally formed with a first electrode sc4 of the data writing transistor T4, and is connected to the active layer A4 of the data writing transistor T4 through a via hole V22 passing through insulating layers. For example, the via hole V22 passes through the insulating layers between the source and drain metal layer 360 and the first active semiconductor layer 310, namely the first insulating layer 510 to the fifth insulating layer 560, so that the first terminal of the fourth connecting electrode Co4 is connected to the source region or the drain region corresponding to the data writing transistor T4 in first active semiconductor layer 310.

For example, the fifth connecting electrode Co5 is integrally formed with a first electrode sc6 of the second light-emitting control transistor T6, and is connected to the active layer A6 of the second light-emitting control transistor T6 through a via hole V27 passing through insulating layers. The via hole V27 passes through the insulating layers between the source and drain metal layer 360 and the first active semiconductor layer 310, namely through the first insulating layer 510 to the fifth insulating layer 560, so that the first terminal of the fifth connecting electrode Co5 is connected to a source region or a drain region corresponding to the second light-emitting control transistor T6 in the first active semiconductor layer 310.

For example, the first initial signal line Vinit1 is integrally formed with a second electrode fc1 of the first reset transistor T1, and is connected to the active layer A1 of the first reset transistor T1 through a via hole V21 passing through insulating layers. For example, the via hole V21 passes through the insulating layers between the source and drain metal layer 360 and the first active semiconductor layer 310, namely through the first insulating layer 510 to the fifth insulating layer 560 and the buffer layer 540, so that the first initial signal line Vinit1 is connected to a source region or a drain region corresponding to the first reset transistor T1 in the first active semiconductor layer 310.

For example, the first initial signal line Vinit1 extends along the first direction X, and the orthographic projection of the first initial signal line Vinit1 on the base substrate is between the orthographic projection of the first reset signal line Re1 on the base substrate and the orthographic projection of the second reset signal line Re2 on the base substrate.

For example, the first initial signal line Vinit1 is integrally formed with the second electrode of the first reset transistor T1 of the pixel circuit in the yth row and the first electrode of the second reset transistor T7 of the pixel circuit in the (y−1)-th row. That is, the first initial signal line Vinit1 is integrally formed with the second electrode of the first reset transistor T1 of the sub-pixel in the current row and the first electrode of the second reset transistor T7 of the pixel circuit in the previous row.

For example, the second initial signal line Vinit2 is integrally formed with a first electrode fc7 of the second reset transistor T7, and is connected to the active layer A7 of the second reset transistor T7 through a via hole V28 passing through insulating layers. For example, the via hole V28 passes through the insulating layers between the source and drain metal layer 360 and the first active semiconductor layer 310, namely through the first insulating layer 510 to the fifth insulating layer 560, so that the second initial signal line Vinit2 is connected to a source region or a drain region corresponding to the second reset transistor T7 in the first active semiconductor layer 310.

For example, the second initial signal line Vinit2 extends along the first direction X, and the orthographic projection of the second initial signal line Vinit2 on the base substrate is on a side of the orthographic projection of the second reset signal line Re2 on the base substrate away from the orthographic projection of the first reset signal line Re1 on the base substrate.

For example, the second initial signal line Vinit2 is integrally formed with the second electrode of the first reset transistor T1 of the pixel circuit in the (y+1)-th row and the first electrode of the second reset transistor T7 of the pixel circuit in the yth row, that is, the second initial signal line Vinit2 is integrally formed with the first electrode of the second reset transistor T7 in the sub-pixel in the current row and the second electrode of the first reset transistor T1 in the sub-pixel in the next row.

For example, the first initial signal line Vinit1 and the second initial signal line Vinit2 may be connected by connecting line extending along the second direction Y, for example, the connecting line may be disposed in the fourth conductive layer or other layers. The connecting line may be connected to the first initial signal line Vinit1 and the second initial signal line Vinit2 through a via hole passing through insulating layers, so that the first initial signal line Vinit1 and the second initial signal line Vinit2 are electrically connected. In the embodiment of the present disclosure, the first initial signal line Vinit1 extending in a lateral direction and the second initial signal line Vinit2 extending in the lateral direction is connected to the vertically extending connecting line disposed in a different layer by means of jumper connection, so that the initial signal line Vinit is wired on the base substrate in a grid, and has a mesh structure, which makes the resistance of the initial signal line Vinit smaller and the voltage drop (IR drop) lower. In addition, the distribution of the initial signal line Vinit on the base substrate is made more uniform, thereby improving the stability of the initial voltage provided by the initial signal line Vinit.

FIG. 4M shows a schematic diagram of insulating layer via holes V41~V43 between the source and drain metal layer 360 and the fourth conductive layer 370, FIG. 4N shows a partial schematic diagram of stacking the fourth conductive layer 370 with the insulating layer via holes as shown in FIG. 4M, FIG. 4O is a schematic diagram of stacking the fourth conductive layer 370 on the basis of FIG. 4L.

As shown in FIGS. 4M to 4O, the fourth conductive layer 370 includes the data line Vda, the first sub-voltage line VDD1, and a sixth connecting electrode Co6. The data line Vda and the first sub-voltage line VDD1 are disposed in the same layer, and both the data line Vda and the first sub-voltage line VDD1 extend along the second direction Y, and the data line Vda and the first sub-voltage line VDD1 are arranged in the first direction X. The sixth connecting electrode Co6 and the first sub-voltage line VDD1 are disposed in the same layer, and the sixth connecting electrode Co6 is disposed on a side of the first sub-voltage line VDD1 away from the data line Vda in the first direction X.

For example, as shown in FIG. 3 and FIG. 4N, the orthographic projection of the first sub-voltage line VDD1 on the base substrate is between the orthographic projection of the active layer of the data writing transistor T4 on the base substrate and the orthographic projection of the active layer of the threshold compensation transistor T2 on the base substrate, and the orthographic projection of the first sub-voltage line VDD1 on the base substrate at least partially overlaps with the orthographic projection of the second electrode plate of the parasitic capacitor Cst2 on the base substrate. The orthographic projection of the first sub-voltage line VDD1 on the base substrate at least partially overlaps with the orthographic projection of the storage capacitor Cst1 on the base substrate.

For example, as shown in FIGS. 4K and 4N, the first sub-voltage line VDD1 includes a first protruding portion P1. A third terminal of the third connecting electrode Co3 is connected to the first protruding portion P1 of the first sub-voltage line VDD1 through a via hole V42 passing through insulating layers, and the via hole V42 passes through the sixth insulating layer 570. The first sub-voltage line VDD1 is connected to the third connecting electrode Co3 in the source and drain metal layer 360, and the third connecting electrode Co3 is connected to the first electrode fc5 of the first light-emitting control transistor T5 and the second electrode plate CC2 of the storage capacitor, so that the first sub-voltage line VDD1 is electrically connected to the first electrode fc5 of the first light-emitting control transistor T5 and the second electrode plate CC2 of the storage capacitor.

For example, as shown in FIGS. 4K, 4N and 4O, the first sub-voltage line VDD1 further includes a second protruding portion P2, the second protruding portion P2 is in a hollow square shape, and an orthographic projection of the second protruding portion P2 on the base substrate at least partially overlaps the orthographic projection of the active layer A8 of the current-leakage prevention transistor T8 on the base substrate, to block light for the current-leakage prevention transistor T8. The current-leakage prevention transistor T8 is an oxide semiconductor thin film transistor, the oxide semiconductor thin film transistor is sensitive to light. The second protruding portion P2 covers the current-leakage prevention transistor T8, which can block light for the current-leakage prevention transistor T8 and reduce the effect of light on the current-leakage prevention transistor.

For example, as shown in FIGS. 4K, 4N and 4O, the orthographic projection of the data line Vda on the base substrate at least partially overlaps the orthographic projection of the active layer of the data writing transistor T4 on the base substrate and the orthographic projection of the active layer of the first light-emitting control transistor T5 on the base substrate. For example, the data line Vda is close to the active layer A4 of the data writing transistor T4 and the active layer A5 of the first light-emitting control transistor T5, which facilitates the connection between the data line Vda and the data writing transistor T4, avoids wiring, and reduces the size of the display panel.

For example, as shown in FIGS. 4K, 4N and 4O, the fourth connecting electrode Co4 is connected to the data line Vda through a via hole V41 passing through insulating layers, and the via hole V41 passes through the sixth insulating layer 570. The data line Vda includes a third protruding portion P3, and the third protruding portion P3 at least partially overlaps with the via hole V41 of the insulating layer in the direction perpendicular to the base substrate. The third protruding portion P3 of the data line Vda is connected to the first electrode sc4 of the data writing transistor in the fourth connecting electrode Co4 through the via hole V41 to electrically connect the data line Vda to the first electrode sc4 of the data writing transistor T4. The orthographic projection of the via hole V41 on the base substrate and the via hole V22 may at least partially overlap in the direction perpendicular to the base substrate, although the embodiment of the present disclosure is not limited thereto.

For example, as shown in FIGS. 4K, 4N and 4O, the fifth connecting electrode Co5 and the sixth connecting electrode Co6 at least partially overlap in the direction perpendicular to the base substrate, and the fifth connecting electrode Co5 is connected to the sixth connecting electrode Co6 through a via hole V43 passing through insulating layer, and the via hole V43 passes through the sixth insulating layer 570. The orthographic projection of the via hole V43 on the base substrate may at least partially overlap with the via hole V21 in the direction perpendicular to the base substrate, although the embodiment of the present disclosure is not limited thereto.

Part A-A' of FIG. 5A shows a schematic diagram of the cross-section corresponding to the second light-emitting control transistor T6 in FIG. 3. As shown in FIG. 4 and the part A-A' of FIG. 5A, the sixth connecting electrode Co6 is connected to the first terminal (eg, the first electrode) of the light-emitting element 121 through a via hole V51 passing through insulating layer, for example, the via hole V51 passes through the planarization layer 580, thereby connecting the first electrode sc6 of the second light-emitting control transistor T6 to the first electrode of the light-emitting element 121 through the sixth connecting electrode Co6.

For example, as shown in FIG. 4K, the orthographic projection of the via hole V51 on the base substrate and the orthographic projection of the light-emitting control signal line EM1 on the base substrate at least partially overlap in the second direction Y, although the embodiment of the present disclosure is not limited thereto. The position of the via hole V51 may be set flexibly and may be adapted to the pixel circuit of various pixel arrangements. In addition, the position of the via hole V51 may also be flexibly adjusted according to the setting position of the first electrode of the light-emitting element, so that the via hole V51 is closer to the first electrode of the light-emitting element, reducing the wiring of the first electrode of the light-emitting element, and the connection between the first electrode of the light-emitting element and the first electrode of the second light-emitting control transistor T6 is more flexible.

For example, the anode layer may include the first electrode (ie, the anode) of the light-emitting element 121.

For example, the plurality of sub-pixels in the display panel may include a red sub-pixel R, a blue sub-pixel B, and a green sub-pixel G. For example, the light-emitting element 121 in the red sub-pixel R emits red light, the light-emitting element 121 in the blue sub-pixel B emits blue light, and the light-emitting element 121 in the green sub-pixel G emits green light. For example, the area of the first electrode of a blue sub-pixel B is larger than the area of the first electrode of a green sub-pixel G, and is larger than the area of the first electrode of a red sub-pixel R.

FIG. 5A includes three parts: part A-A', part B-B' and part C-C'. The part A-A' is a schematic structural diagram of the cross-section (that is, at the section line A-A' in FIG. 4O) corresponding to the second light-emitting control transistor T6 in FIG. 3, the part B-B' is a schematic structural diagram of the cross-section (that is, at the section line B-B' in FIG. 4O) corresponding to the current-leakage prevention transistor T8 in FIG. 3, and the part C-C' is a schematic structural diagram of the cross-section (that is, at the section line C-C' in FIG. 4O) corresponding to the storage capacitor Cst1 in FIG. 3. FIG. 5A is a schematic diagram of the splicing of the three-part cross-sectional structures.

For example, as shown in FIG. 5A, the base substrate 10 includes a plurality of layer structures, and the plurality of layer structures are all made of flexible materials.

For example, the active semiconductor layer 310 is formed on the base substrate 10, and FIG. 5A shows the active layer A6 which belongs to the second light-emitting control transistor T6 and is disposed in the active semiconductor layer 310.

For example, the first insulating layer 510 is formed on a side of the active semiconductor layer 310 away from the base substrate 10, and a first conductive layer 320 is formed on a side of the first insulating layer 510 away from the active semiconductor layer 310. FIG. 5A shows the light-emitting control signal line EM1 disposed in the first conductive layer 320 and the first electrode plate CC1 which belongs to the storage capacitor and is disposed in the first conductive layer 320.

For example, the second insulating layer 520 is formed on a side of the first conductive layer 320 away from the first insulating layer 510, the second conductive layer 330 is formed on a side of the second insulating layer 520 away from the first conductive layer 320. FIG. 5A shows the first gate electrode gc81 (the first sub-control signal line EM21) which belongs to the current-leakage prevention transistor T8 and is disposed in the second conductive layer 330 and the second electrode plate CC2 which belongs to the storage capacitor and is disposed in the second conductive layer 330.

For example, the third insulating layer 530 is formed on a side of the second conductive layer 330 away from the second insulating layer 520, the buffer layer 540 is formed on a side of the third insulating layer 530 away from the second conductive layer 330, and the second active semiconductor layer 340 is formed on a side of the buffer layer 540 away from the third insulating layer 530, FIG. 5A shows the active layer A8 which belongs to the current-leakage prevention transistor T8 and is disposed in the second active semiconductor layer 340 and the third electrode plate CC3 which belongs to the storage capacitor and is disposed in the second active semiconductor layer 340.

For example, the fourth insulating layer 550 is formed on a side of the second active semiconductor layer 340 away from the buffer layer 540, the third conductive layer 350 is formed on a side of the fourth insulating layer 550 away from the second active semiconductor layer 340, FIG. 5A shows the second gate electrode gc82 (the second sub-control signal line EM22) which belongs to the current-leakage prevention transistor and is disposed in the third conductive layer 350.

For example, the fifth insulating layer 560 is formed on a side of the third conductive layer 350 away from the fourth insulating layer 550, the source and drain metal layer 360 is formed on a side of the fifth insulating layer 560 away from the third conductive layer 350. FIG. 5A shows the source or drain sc6 (formed integrally with the fifth connecting electrode Co5) which is connected to the active layer of the second light-emitting control transistor T6 and is disposed in the source and drain metal layer 360, the source or drain fc8 (formed integrally with the first connecting electrode Co1) which is connected to the active layer of the current-leakage prevention transistor T8, the third connecting electrode Co3 which is connected to the second electrode plate CC2 of the storage capacitor, and the source or drain sc8 (formed integrally with the second connecting electrode Co2) which is connected to the first electrode plate CC1 and the third electrode plate CC3 of the storage capacitor and the active layer of the current-leakage prevention transistor T8.

For example, the sixth insulating layer 570 is formed on a side of the source and drain metal layer 360 away from the fifth insulating layer 560, and the fourth conductive layer 370 is formed on a side of the sixth insulating layer 570 away from the source and drain metal layer 360. FIG. 5A shows the sixth connecting electrode Co6 which is connected to the fifth connecting electrode Co5 and is disposed in the fourth conductive layer 370 and the first sub-voltage line VDD1 which is connected to the third connecting electrode Co3 and is disposed in the fourth conductive layer 370.

For example, the planarization layer 580 is formed on a side of the fourth conductive layer 370 away from the sixth insulating layer 570, and the first electrode of the light-emitting element 121 is formed on a side of the planarization layer 580 away from the fourth conductive layer 370.

FIG. 5B and FIG. 5C are respectively another schematic cross-sectional view provided by some embodiments of the present disclosure. The difference between FIG. 5C and FIG. 5A and the difference between FIG. 5C and FIG. 5B are the part C-C', specifically, the above description about FIG. 5B and FIG. 5C may be referred to.

For example, the parameters of the storage capacitor Cst1 in different sub-pixels on the display substrate 100 may be different.

For example, in some embodiments, the parameters of the storage capacitor Cst1 of sub-pixels of different color (red sub-pixel R, blue sub-pixel B and green sub-pixel G) may be different. Because the sub-pixels of the three colors of RGB have different requirements for brightness or charging speed, the storage capacitors Cst1 of the three kinds of sub-pixels may be set differently. For example, the parameters of the storage capacitor Cst1 of the blue sub-pixel B may be made different from those of the storage capacitor Cst1 of the red sub-pixel R. The driving current required by the light-emitting element of the blue sub-pixel B may be greater than the driving current required by the light-emitting element of the red sub-pixel R. At the light-emitting stage, a drop in the gate voltage of the driving transistor may cause the driving current to increase, so that the gate voltage of the driving transistor of the blue sub-pixel B may be lower than the gate voltage of the driving transistor of the red sub-pixel R, that is, the capacitance value required by the storage capacitor Cst1 of the blue sub-pixel B is smaller than the capacitance value required by the storage capacitor Cst1 of the red sub-pixel R. Therefore, the area of the electrode plate of the storage capacitor Cst1 of the blue sub-pixel B may be set to be smaller than the area of the electrode plate of the storage capacitor Cst1 of the red sub-pixel R. For example, the area of the third electrode plate CC3 disposed in the second active semiconductor layer 340 of the blue sub-pixel B may be made smaller than the area of the third electrode plate CC3 disposed in the second active semiconductor layer 340 of the red sub-pixel R. Further, the capacitance value of the storage capacitor Cst1 of the blue sub-pixel B may be made smaller than the capacitance value of the storage capacitor Cst1 of the red sub-pixel R, the blue sub-pixel B is made to have a lower charging rate than the red sub-pixel R in order to obtain a higher driving current and higher brightness. In some embodiments, the parameters of the storage capacitor Cst1 of the red sub-pixel R may be the same as the parameters of the storage capacitor Cst1 of the green sub-pixel G.

For example, in a pixel arrangement, for the pixel driving circuits corresponding to the red sub-pixel R, the green sub-pixel G. and the blue sub-pixel B, respectively, the driving circuits corresponding to the green sub-pixels G are arranged in a column, and the driving circuits corresponding to the red sub-pixels R and the blue sub-pixels B are arranged in a column.

Figure 6:
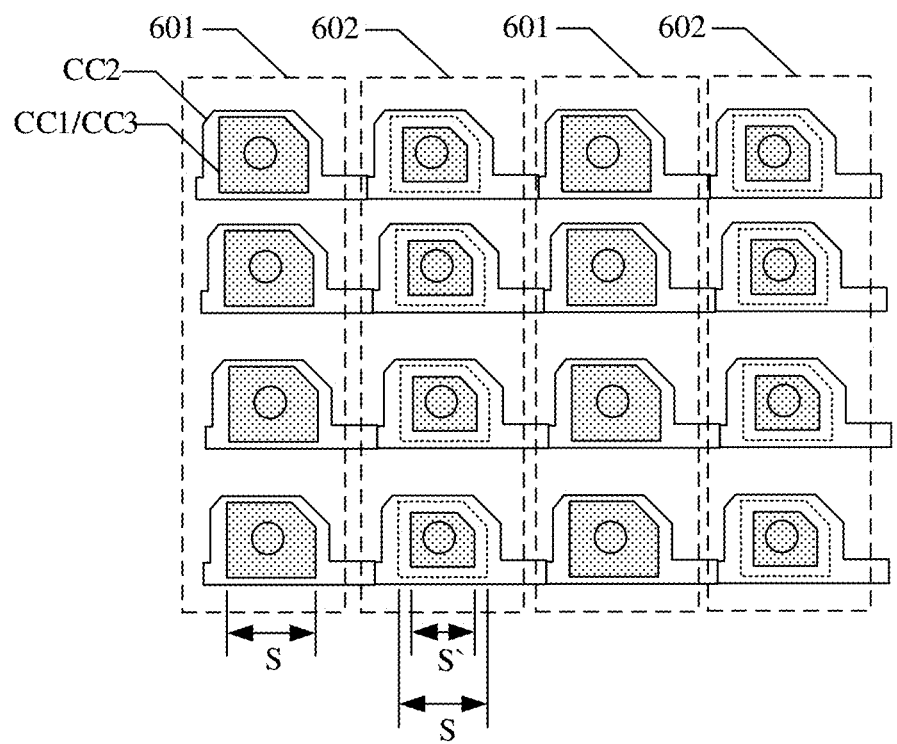
FIG. 6 is a schematic diagram of the stacking of some structural layers according to some embodiments of the present disclosure.

FIG. 6 is a schematic diagram of the stacking of some structural layers according to some embodiments of the present disclosure. For example, FIG. 6 is a schematic diagram of stacking the second electrode plate CC2 and the third electrode plate CC3 of a plurality of sub-pixels or stacking the second electrode plate CC2 and the first electrode plate CC1 of a plurality of sub-pixels. As shown in FIG. 6, the pixel circuits of the plurality of sub-pixels may be alternately arranged in the following manner: a column 601 is the pixel circuits of the green sub-pixels G, and another adjacent column 602 is corresponding to the pixel circuits of the red sub-pixels R and the blue sub-pixels B. For example, in some embodiments, the area of the third electrode plate CC3 in the pixel circuit of the G sub-pixel (green sub-pixel) may be made larger than the area of the third electrode plate CC3 in the pixel circuit of the R/B sub-pixel (red sub-pixel or blue sub-pixel). For example, the area of the third electrode plate CC3 in the pixel circuit of the R/B sub-pixel is reduced from the original size S to the size S', so that the storage capacitance value of the pixel circuit of the G sub-pixel can be larger than the storage capacitor value of the pixel circuit shared by the RB sub-pixel, which makes the G sub-pixel have a higher charging rate than RB sub-pixel, so as to obtain a lower driving current and lower brightness to balance the display difference caused by the G sub-pixel being over bright.

In some embodiments, for example, the area of the first electrode plate CC1 in the pixel circuit of the G sub-pixel (green sub-pixel) may be made larger than the area of the first electrode plate CC1 in the pixel circuit of the R/B sub-pixel (red sub-pixel or blue sub-pixel). For example, the area of the first electrode plate CC1 in the pixel circuit of the R/B sub-pixel is reduced from the original size S to the size S', so that the storage capacitance value of the pixel circuit of the G sub-pixel can be larger than the storage capacitor value of the pixel circuit corresponding to the R/B sub-pixel, which makes the G sub-pixel have a higher charging rate than RB sub-pixel, so as to obtain a lower driving current and lower brightness to balance the display difference caused by the G sub-pixel being over bright.

In some embodiments, for example, continue to refer to FIG. 6, the area of the first electrode plate CC1 and the area of the third electrode plate CC3 (only one of which is shown in FIG. 6) in the pixel circuit of the G sub-pixel (green sub-pixel) may be both larger than the area of the first electrode plate CC1 and the area of the third electrode plate CC3 in the pixel circuit of the R/B sub-pixel (red sub-pixel or blue sub-pixel). For example, the area of the first electrode plate CC1 in the pixel circuit of the R/B sub-pixel is further reduced from S', or the area of the third electrode plate CC3 in the pixel circuit of the R/B sub-pixel is further reduced from S', in order to alleviate display difference.

In some embodiments, the area of the first electrode plate CC1 in the pixel circuit of the G sub-pixel may be made larger than the area of the first electrode plate CC1 in the pixel circuit of the R/B sub-pixel, for example, the area of the first electrode plate CC1 in the pixel circuit corresponding to the RB sub-pixel may be reduced.

In some examples, the area of the first electrode plate CC1 in the pixel circuit of the G sub-pixel may be made larger than the area of the first electrode plate CC1 in the pixel circuit of the R/B sub-pixel, and the area of the third electrode plate CC3 in the pixel circuit of the G sub-pixel may be made larger than the area of the third electrode plate CC3 in the pixel circuit of the R/B sub-pixel. For example, the area of the first electrode plate CC1 and the area of the third electrode plate CC3 in the pixel circuit of the R/B sub-pixel may be both reduced.

Figure 7:
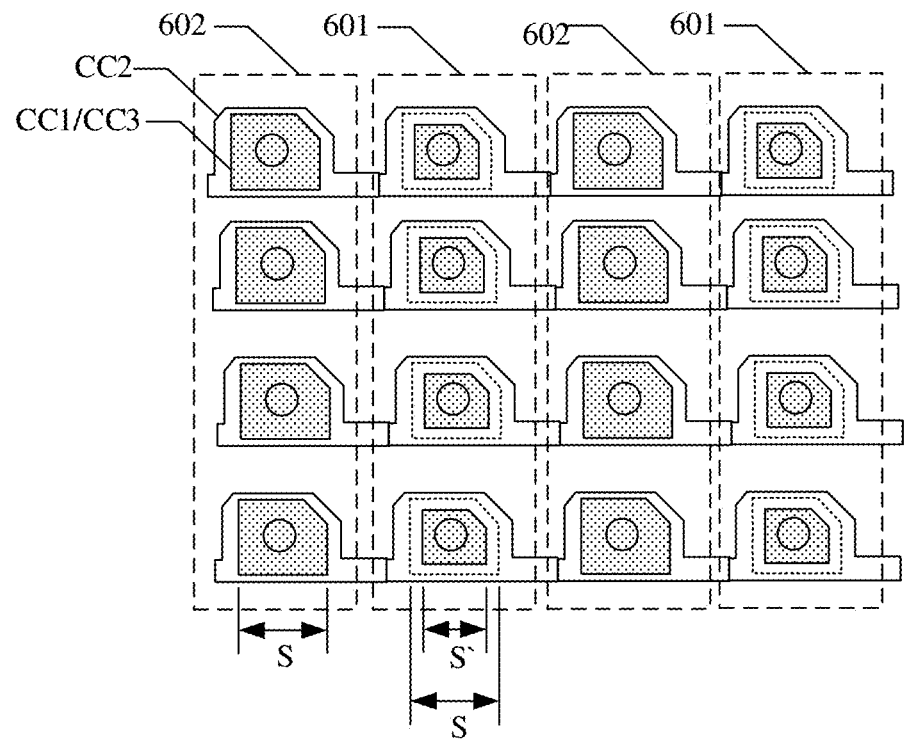
FIG. 7 is a schematic diagram of the stacking of some structural layers according to some embodiments of the present disclosure.

For example, in some embodiments, referring to FIG. 7, considering that the brightness of the G sub-pixel is higher than that of the R/B pixel, the storage capacitance of the G sub-pixel may be appropriately reduced, so that the G sub-pixel can be easily turned off, which is also conducive to improving the display effect. For example, the area of the first electrode plate CC1 of the G sub-pixel may be set to be smaller than the area of the first electrode plate CC1 of the R/B sub-pixel, and/or the area of the third electrode plate CC3 of the G sub-pixel may be set smaller than the area of the third electrode plate CC3 of the R/B sub-pixel. It is similar to the foregoing embodiment and will not be repeated here.

Figure 8:
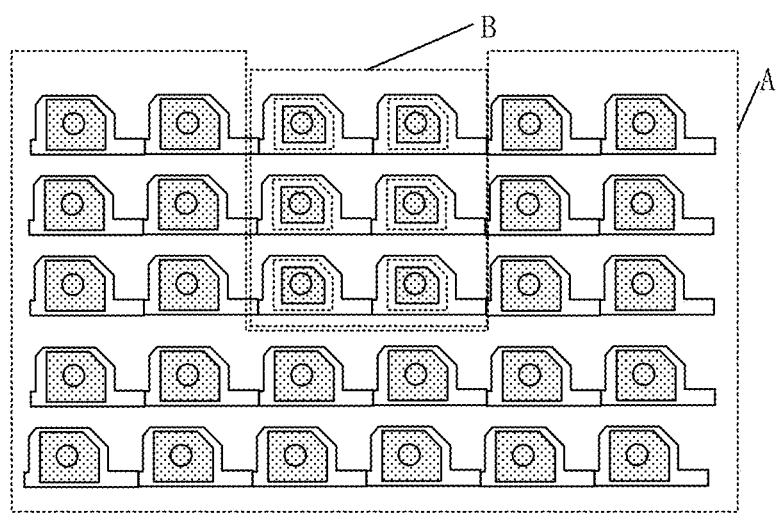
FIG. 8 is a schematic diagram of the stacking of some structural layers according to some embodiments of the present disclosure.

For example, in some embodiments, referring to FIG. 8, in the case where the display substrate is applied to an electronic device with an under-screen camera, the parameters of the storage capacitor Cst1 of the sub-pixel corresponding to a camera region B on the display substrate may be different from the parameters of the storage capacitor Cst1 of the sub-pixel corresponding to other regions A, such as, normal display region. For example, the lead material and length requirements of the pixel circuit driving the camera region are different from those of the pixel circuit in other regions. Therefore, the storage capacitor Cst1 of the sub-pixel in the camera region B may be set differently from the storage capacitor Cst1 of the sub-pixel in other regions A. For example, the sub-pixels in the camera region B require longer leads than other regions A, so the resistance is larger and a larger driving current is required. The area of the electrode plate of the storage capacitor Cst1 of the sub-pixel in the camera region B may be smaller than that of other regions, for example, the area of the third electrode plate of the storage capacitor Cst1 of the sub-pixel in the camera region may be made smaller than that of other regions, which can make the capacitance value of the storage capacitor Cst1 of the sub-pixel in the camera region smaller than that in other regions, so that the sub-pixels in the camera region B have a lower charging rate than those in other regions A, in order to obtain a higher driving current.

For example, in some embodiments, in the case where the display substrate is applied to an electronic device with an under-screen camera, the differentiated design of the storage capacitors Cst1 of G pixels and the storage capacitor Cst1 of R pixels and B pixels may be further adopted. For example, the sub-pixels of the camera region B adopt the differentiated design of the storage capacitor Cst1 of the G pixel and the storage capacitor Cst1 of R pixels and B pixels in the foregoing embodiment. Alternatively, the sub-pixels in other regions A adopt the differentiated design of the G pixel and the storage capacitor Cst1 of R pixels and B pixels in the foregoing embodiment, which will not be repeated here.

For example, in addition to adjusting the electrode plate area of the storage capacitor Cst1 to adjust the performance of the storage capacitor Cst1 of different sub-pixels, the performance of the storage capacitor Cst1 may also be adjusted by adjusting other parameters of the storage capacitor Cst1 of different sub-pixels, such as the film thickness of the electrode plates, the distance between adjacent electrode plates (For example the distance between the first electrode plate and the second electrode plate and/or the distance between the second electrode plate and the third electrode plate), and the shape of the electrode plates, so as to meet the different performance requirements of different sub-pixels on the storage capacitor Cst1.

Figure 9:
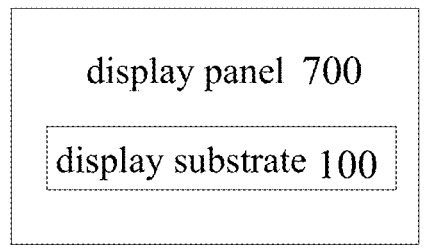
FIG. 9 is a schematic diagram of a display panel according to at least one embodiment of the present disclosure.

At least one embodiment of the present disclosure further provides a display panel. FIG. 9 is a schematic diagram of a display panel according to at least one embodiment of the present disclosure. As shown in FIG. 9, the display panel 700 includes the display substrate 100 provided by any embodiment of the present disclosure, for example, the display substrate 100 shown in FIG. 1.

For example, the display panel 700 may be a liquid crystal display panel or an organic light emitting diode (OLED) display panel or the like. For example, in the case where the display panel 700 is a liquid crystal display panel, the display substrate 100 may be an array substrate or a color filter substrate. In the case where the display panel 700 is an organic light emitting diode display panel, the display substrate 100 may be an array substrate.

For example, the display panel 700 may be a rectangular panel, a circular panel, an oval panel, a polygonal panel, or the like. In addition, the display panel 700 may be not only a flat panel, but also a curved panel, or even a spherical panel.

For example, the display panel 700 may also have a touch function, that is, the display panel 700 may be a touch display panel.

For example, the display panel 700 may be applied to any product or component with a display function, such as a mobile phone, a tablet computer, a television, a monitor, a notebook computer, a digital photo frame, a navigator, and the like.

For example, the display panel 700 may be a flexible display panel, so as to meet various practical application requirements, for example, the display panel 700 may be applied to a curved screen and the like.

It should be noted that the display panel 700 may further include other components, such as a data driving circuit, a timing controller, and the like, which are not limited in the embodiments of the present disclosure. For the sake of clarity and conciseness, the embodiments of the present disclosure do not show all the constituent units of the display panel 700. In order to realize the basic functions of the display panel 700, those skilled in the art may provide or set other structures not shown according to specific needs, which are not limited in the embodiments of the present disclosure.

Regarding the technical effects of the display panel 700 provided by the above embodiments, reference may be made to the technical effects of the display substrate 100 provided in the embodiments of the present disclosure, which will not be repeated here.

The following should be noted:

(1) Only the structures involved in the embodiments of the present disclosure are illustrated in the drawings of the embodiments of the present disclosure, and other structures can refer to usual designs;

(2) For clarity, in the drawings used to describe the embodiments of the present disclosure, the thickness of layers or regions is enlarged or reduced, that is, these drawings are not drawn to actual scale. It can be understood that when an element such as a layer, film, region or substrate is said to be "above" or "below" another element, the element may be "directly" above or "below" another element or intermediate elements may be present.

(3) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A display substrate, comprising:
    a base substrate; and
    a plurality of sub-pixels on the base substrate,
    wherein each of the plurality of sub-pixels comprises a light-emitting element and a pixel circuit for driving the light-emitting element to emit light, the pixel circuit comprises a driving sub-circuit, a data writing sub-circuit, a threshold compensation sub-circuit, a current-leakage prevention sub-circuit and a storage sub-circuit;
    the driving sub-circuit comprises a control terminal, a first terminal and a second terminal, and the driving sub-circuit is configured to control a driving current flowing through the light-emitting element;
    the data writing sub-circuit is connected to the first terminal of the driving sub-circuit, a data line and a scan signal line, and the data writing sub-circuit is configured to write a data signal provided by the data line into the first terminal of the driving sub-circuit in response to a gate scan signal provided by the scan signal line;
    the threshold compensation sub-circuit is connected to the second terminal of the driving sub-circuit, the current-leakage prevention sub-circuit and the scan signal line, and the threshold compensation sub-circuit is configured to write a compensation signal based on the data signal into the control terminal of the driving sub-circuit in response to the gate scan signal provided by the scan signal line;
    the current-leakage prevention sub-circuit is connected to the control terminal of the driving sub-circuit, the threshold compensation sub-circuit, the storage sub-circuit and a current-leakage prevention control signal line, and the current-leakage prevention sub-circuit is configured to prevent current-leakage of the control terminal of the driving sub-circuit;
    the storage sub-circuit is connected to the control terminal of the driving sub-circuit and a first voltage line, and the storage sub-circuit is configured to store the compensation signal and keep the compensation signal at the control terminal of the driving sub-circuit,
    wherein the storage sub-circuit comprises a storage capacitor, and the storage capacitor comprises a first electrode plate, a second electrode plate and a third electrode plate, the first electrode plate and the third electrode plate are electrically connected to each other and are in different layers with respect to the base substrate, and the second electrode plate at least partially overlaps the first electrode plate and the third electrode plate in a direction perpendicular to the base substrate.

2. The display substrate according to claim 1, wherein the second electrode plate is between the first electrode plate and the third electrode plate in the direction perpendicular to the base substrate; and
    the first electrode plate is connected to the control terminal of the driving sub-circuit, the second electrode plate is connected to the first voltage line, the third electrode plate is connected to the control terminal of the driving sub-circuit.

3. The display substrate according to claim 1, wherein the threshold compensation sub-circuit comprises a threshold compensation transistor, and the data writing sub-circuit comprises a data writing transistor;
    an active layer of the threshold compensation transistor and an active layer of the data writing transistor are integrally formed, and an orthographic projection of the active layer of the threshold compensation transistor on the base substrate and an orthographic projection of the active layer of the data writing transistor on the base substrate are respectively on both sides of an orthographic projection of the storage capacitor on the base substrate;
    a gate electrode of the threshold compensation transistor and a gate electrode of the data writing transistor are parallel in a first direction, and the gate electrode of the threshold compensation transistor and the gate electrode of the data writing transistor are integrally formed with the scan signal line.

4. The display substrate according to claim 3, wherein the current-leakage prevention sub-circuit comprises a current-leakage prevention transistor, an active layer of the current-leakage prevention transistor, the active layer of the threshold compensation transistor and the active layer of the data writing transistor all extend along a second direction and are arranged side by side along the first direction, and the first direction intersects the second direction; and
    an orthographic projection of the active layer of the current-leakage prevention transistor on the base substrate is on a side of the orthographic projection of the active layer of the threshold compensation transistor on the base substrate away from the orthographic projection of the active layer of the data writing transistor on the base substrate.

5. The display substrate according to claim 4, wherein a gate electrode of the current-leakage prevention transistor and the current-leakage prevention control signal line are integrally formed, the current-leakage prevention control signal line extends along the first direction, and an orthographic projection of the current-leakage prevention control signal line on the base substrate is between an orthographic projection of the scan signal line on the base substrate and the orthographic projection of the storage capacitor on the base substrate.

6. The display substrate according to claim 5, wherein the current-leakage prevention control signal line comprises a first sub-control signal line and a second sub-control signal line, an orthographic projection of the first sub-control signal line on the base substrate and an orthographic projection of the second sub-control signal line on the base substrate at least partially overlap.

7. The display substrate according to claim 6, wherein the gate electrode of the current-leakage prevention transistor comprises a first gate electrode and a second gate electrode,
    the first gate electrode and the first sub-control signal line are integrally formed, and the second gate electrode and the second sub-control signal line are integrally formed; and
    the active layer of the current-leakage prevention transistor is between the first gate electrode and the second gate electrode in the direction perpendicular to the base substrate.

8. The display substrate according to claim 4, wherein the active layer of the current-leakage prevention transistor is on a same layer as the third electrode plate;
   a material of the active layer of the current-leakage prevention transistor and a material of the third electrode plate comprise an oxide semiconductor material.

9. The display substrate according to claim 4, wherein the pixel circuit further comprises a first reset sub-circuit; and
   the first reset sub-circuit is connected to the threshold compensation sub-circuit, the current-leakage prevention sub-circuit, a first initial signal line and a first reset control signal terminal, and is configured to apply an initial voltage provided by the first initial signal line to the control terminal of the driving sub-circuit through the current-leakage prevention sub-circuit in response to a reset control signal received by the first reset control signal terminal.

10. The display substrate according to claim 9, wherein the first reset sub-circuit comprises a first reset transistor;
    an active layer of the first reset transistor is integrally formed with the active layer of the threshold compensation transistor;
    an orthographic projection of the active layer of the first reset transistor on the base substrate is on a side of the orthographic projection of the active layer of the threshold compensation transistor on the base substrate away from the orthographic projection of the storage capacitor on the base substrate.

11. The display substrate according to claim 10, further comprising:
    a first connecting electrode,
    wherein a first terminal of the first connecting electrode is integrally formed with a first electrode of the first reset transistor and a first electrode of the threshold compensation transistor, and the first terminal of the first connecting electrode is respectively connected to the active layer of the compensation transistor and the active layer of the first reset transistor through a via hole passing through an insulating layer;
    a second terminal of the first connecting electrode is integrally formed with a first electrode of the current-leakage prevention transistor, and the second terminal of the first connecting electrode is connected to the active layer of the current-leakage prevention transistor through a via hole passing through an insulating layer.

12. The display substrate according to claim 11, further comprising:
    a second connecting electrode,
    wherein a first terminal of the second connecting electrode is integrally formed with a second electrode of the current-leakage prevention transistor, and the first terminal of the second connecting electrode is connected to the active layer of the current-leakage prevention transistor through a via hole passing through an insulating layer;
    a second terminal of the second connecting electrode is connected to the first electrode plate of the storage capacitor through a via hole passing through an insulating layer; and
    a third terminal of the second connecting electrode is connected to the third electrode plate of the storage capacitor through a via hole passing through an insulating layer.

13. The display substrate according to claim 12, further comprising:
    a parasitic capacitor, connected to the second electrode of the current-leakage prevention transistor and the scan signal line;
    wherein a first electrode plate of the parasitic capacitor is integrally formed with the scan signal line;
    a second electrode plate of the parasitic capacitor and the first electrode plate of the parasitic capacitor at least partially overlap in the direction perpendicular to the base substrate, the second electrode plate of the parasitic capacitor and the third electrode plate of the storage capacitor are on a same layer, and an orthographic projection of the second electrode plate of the parasitic capacitor on the base substrate is between the orthographic projection of the active layer of the threshold compensation transistor on the base substrate and the orthographic projection of the active layer of the data writing transistor on the base substrate; and
    the second electrode plate of the parasitic capacitor is connected to a fourth terminal of the second connecting electrode through a via hole passing through an insulating layer.

14. The display substrate according to claim 13, wherein the driving sub-circuit comprises a driving transistor;
    a gate electrode of the driving transistor is integrally formed with the first electrode plate of the storage capacitor; and
    an active layer of the driving transistor, the active layer of the data writing transistor and the active layer of the threshold compensation transistor are integrally formed, and an orthographic projection of the active layer of the driving transistor on the base substrate is between the orthographic projection of the active layer of the data writing transistor on the base substrate and the orthographic projection of the active layer of the threshold compensation transistor on the base substrate.

15. The display substrate according to claim 14, wherein the pixel circuit further comprises a first light-emitting control sub-circuit and a second light-emitting control sub-circuit;
    the first light-emitting control sub-circuit is connected to the first voltage line, the first terminal of the driving sub-circuit, and a light-emitting control signal line, and the first light-emitting control sub-circuit is configured to apply a first voltage provided by the first voltage line to the first terminal of the driving sub-circuit in response to a light-emitting control signal provided by the light-emitting control signal line;
    the second light-emitting control sub-circuit is connected to the second terminal of the driving sub-circuit, a first terminal of the light-emitting element, and the light-emitting control signal line, and the second light-emitting control sub-circuit is configured to apply the driving current to the first terminal of the light-emitting element in response to the light-emitting control signal provided by the light-emitting control signal line; and
    the light-emitting control signal line extends along the first direction, and an orthographic projection of the light-emitting control signal line on the base substrate is on a side of the orthographic projection of the storage capacitor on the base substrate away from the orthographic projection of the scan signal line on the base substrate.

16. The display substrate according to claim 15, wherein the first light-emitting control sub-circuit comprises a first light-emitting control transistor, and the second light-emitting control sub-circuit comprise a second light-emitting control transistor; and an active layer of the first light-emitting control transistor, an active layer of the second light-emitting control transistor, the active layer of the data writing transistor, the active layer of the threshold compensation transistor, and the active layer of the driving transistor is integrally formed, and the orthographic projection of the active layer of the driving transistor on the base substrate is between orthographic projections of the active layer of the data writing transistor and the active layer of the first light-emitting control transistor and orthographic projections of the active layer of the second light-emitting control transistor and the active layer of the threshold compensation transistor.

17. The display substrate according to claim 16, wherein the first voltage line comprises a first sub-voltage line extending in the second direction and a second sub-voltage line extending in the first direction;
the first sub-voltage line and the second sub-voltage line are at different layers;
an orthographic projection of the first sub-voltage line on the base substrate is between the orthographic projection of the active layer of the data writing transistor on the base substrate and the orthographic projection of the active layer of the threshold compensation transistor on the base substrate, and at least partially overlaps with the orthographic projection of the second electrode plate of the parasitic capacitor on the base substrate; and
the second sub-voltage line is integrally formed with the second electrode plate of the storage capacitor.

18. The display substrate according to claim 17, further comprising:
a third connecting electrode,
wherein a first terminal of the third connecting electrode is integrally formed with a first electrode of the first light-emitting control transistor, and is connected to the active layer of the first light-emitting control transistor through a via hole passing through insulating layers;
a second terminal of the third connecting electrode is connected to the second electrode plate of the storage capacitor through a via hole passing through an insulating layer; and
a third terminal of the third connecting electrode is connected to a first protruding portion of the first sub-voltage line through a via hole passing through an insulating layer.

19. The display substrate according to claim 15, wherein a current-leakage prevention control signal provided by the current-leakage prevention control signal line is identical to or different from the light-emitting control signal provided by the light-emitting control signal line.

20. A display panel, comprising a display substrate which comprises a base substrate; and
a plurality of sub-pixels on the base substrate,
wherein each of the plurality of sub-pixels comprises a light-emitting element and a pixel circuit for driving the light-emitting element to emit light, the pixel circuit comprises a driving sub-circuit, a data writing sub-circuit, a threshold compensation sub-circuit, a current-leakage prevention sub-circuit and a storage sub-circuit;
the driving sub-circuit comprises a control terminal, a first terminal and a second terminal, and the driving sub-circuit is configured to control a driving current flowing through the light-emitting element;
the data writing sub-circuit is connected to the first terminal of the driving sub-circuit, a data line and a scan signal line, and the data writing sub-circuit is configured to write a data signal provided by the data line into the first terminal of the driving sub-circuit in response to a gate scan signal provided by the scan signal line;
the threshold compensation sub-circuit is connected to the second terminal of the driving sub-circuit, the current-leakage prevention sub-circuit and the scan signal line, and the threshold compensation sub-circuit is configured to write a compensation signal based on the data signal into the control terminal of the driving sub-circuit in response to the gate scan signal provided by the scan signal line;
the current-leakage prevention sub-circuit is connected to the control terminal of the driving sub-circuit, the threshold compensation sub-circuit, the storage sub-circuit and a current-leakage prevention control signal line, and the current-leakage prevention sub-circuit is configured to prevent current-leakage of the control terminal of the driving sub-circuit;
the storage sub-circuit is connected to the control terminal of the driving sub-circuit and a first voltage line, and the storage sub-circuit is configured to store the compensation signal and keep the compensation signal at the control terminal of the driving sub-circuit,
wherein the storage sub-circuit comprises a storage capacitor, and the storage capacitor comprises a first electrode plate, a second electrode plate and a third electrode plate, the first electrode plate and the third electrode plate are electrically connected to each other and are in different layers with respect to the base substrate, and the second electrode plate at least partially overlaps the first electrode plate and the third electrode plate in a direction perpendicular to the base substrate.

* * * * *